United States Patent [19]
Kokubo et al.

[11] Patent Number: 5,486,717
[45] Date of Patent: Jan. 23, 1996

[54] SRAM WITH SMALL PLANAR LAYOUT

[75] Inventors: Nobuyuki Kokubo; Kazuya Ikeda, both of Hyogo, Japan

[73] Assignee: Mitsubishi Denki Kabushiki Kaisha, Tokyo, Japan

[21] Appl. No.: 309,833

[22] Filed: Sep. 21, 1994

[30] Foreign Application Priority Data

Oct. 29, 1993 [JP] Japan .................................. 5-272031

[51] Int. Cl.⁶ ................................................... H01L 27/11
[52] U.S. Cl. .................... 257/385; 257/755; 257/904; 257/915; 365/154
[58] Field of Search .................................... 257/903, 904, 257/755

[56] References Cited

U.S. PATENT DOCUMENTS

| | | | |
|---|---|---|---|
| 5,005,068 | 4/1991 | Ikeda et al. | 257/904 |
| 5,239,196 | 8/1993 | Ikeda et al. | 257/903 |
| 5,436,506 | 7/1995 | Kim et al. | 257/903 |

FOREIGN PATENT DOCUMENTS

| | | |
|---|---|---|
| 3-234056 | 10/1991 | Japan . |
| 3-234055 | 10/1991 | Japan . |
| 3-73146 | 11/1991 | Japan . |

OTHER PUBLICATIONS

"A 34-ns 1-Mbit CMOS SRAM Using Triple Polysilicon", Tomohisa Wada et al., IEEE Journal of Solid-State Circuits, vol. SC-22, No. 5, Oct. 1987, pp. 727-732.

"A 20ns 64K NMOS RAM", S. SChuster et al., 1984 IEEE International Solid-STate Circuits Conference Digest of Technical Papers, pp. 226-227.

*Primary Examiner*—Robert P. Limanek
*Attorney, Agent, or Firm*—Lowe, Price, LeBlanc & Becker

[57] ABSTRACT

A memory cell region is provided with a pair of driver transistors as well as a pair of access transistors. Each of the access transistors is formed of a field effect transistor having a gate electrode layer. An insulating layer is formed over the driver transistors and access transistors, and is provided with contact holes located within the memory cell region and reaching the gate electrode layers. Conductive layers are formed on the insulating layer, and are in contact with the gate electrode layers through the contact holes. Thereby, a memory cell structure of an SRAM has a small planar layout area and thus is suitable to high integration.

23 Claims, 28 Drawing Sheets

SRAM WITH SMALL PLANAR LAYOUT

BACKGROUND OF THE INVENTION

1. Field of the Invention

The present invention relates to a semiconductor memory device, and in particular to a semiconductor memory device including a memory device (SRAM: Static Random Access Memory) allowing random write and read.

2. Description of the Background Art

The SRAM have been known as a kind of semiconductor memory device. The SRAM has such advantages over a DRAM (Dynamic Random Access Memory) that refresh operation is not required and a storage state is stable.

FIG. 24 is an equivalent circuit diagram of an SRAM memory cell of a high resistance load type. Referring to FIG. 24, the memory cell includes a pair of high resistances R1 and R2 serving as a load and also includes a pair of driver transistors Q1 and Q2 as well as a pair of access transistors Q3 and Q4.

Each of paired high resistances R1 and R2 has one end connected to a $V_{cc}$ power supply 110 and the other end connected to a storage node N1 or N2.

Each of paired driver transistors Q1 and Q2 and paired access transistors Q3 and Q4 is formed of an MOS (metal Oxide Semiconductor) transistor. Each of paired driver transistors Q1 and Q2 has a source region connected to a GND (ground potential) 112. A drain region of driver transistor Q1 is connected to storage node N1, and the drain region of driver transistor Q2 is connected to storage node N2. A gate of driver transistor Q1 is connected to storage node N2, and a gate of driver transistor Q2 is connected to storage node N1.

One of a pair of source/drain regions of access transistor Q3 is connected to storage node N1, and the other of the source/drain regions is connected to a bit line 107. One of a pair of source/drain regions of access transistor Q4 is connected to storage node N2, and the other of the source/drain regions is connected to a bit line 108. Each of a gate of access transistors Q3 and Q4 is connected to a word line 109.

Now, a memory cell structure of the conventional SRAM of the high resistance load type will be described below.

FIGS. 25–28 are plans showing sections of the memory cell structure of the conventional SRAM at different levels in accordance with the order from a lowermost layer to an uppermost layer. More specifically, FIGS. 25 and 26 show structures of driver transistor pair Q1 and Q2 as well as access transistor pair Q3 and Q4. FIG. 27 shows a structure of high resistance pair R1 and R2, and FIG. 28 shows a structure of the bit lines.

Referring first to FIG. 25, driver transistor pair Q1 and Q2 as well as access transistor pair Q3 and Q4 are formed at a surface of a silicon substrate 301.

Driver transistor Q1 has a drain region 311b, a source region 311c, a gate insulating layer (not shown) and a gate electrode layer 325a. Drain region 311b and source region 311c are formed of n-type diffusion regions and are spaced from each other to define a channel region therebetween. Gate electrode layer 325a is opposed to the channel region with the gate insulating layer therebetween.

Driver transistor Q2 has a drain region 311d, a source region 311e, a gate insulating layer (not shown) and a gate electrode layer 325b. Drain region 311d and source region 311e are formed of n-type diffusion regions and are spaced from each other to define a channel region therebetween. Gate electrode layer 325b is opposed to the channel region with the gate insulating layer therebetween.

Access transistor Q3 has a pair of source/drain regions 311a and 311b, a gate insulating layer (not shown) and a gate electrode layer 315. Source/drain regions 311a and 311b are formed of n-type diffusion regions and are spaced from each other to define a channel region therebetween. Gate electrode 315 is opposed to the channel region with the gate insulating layer therebetween.

Access transistor Q4 has a pair of source/drain regions 321a and 321b, a gate insulating layer (not shown) and a gate electrode layer 315. Source/drain regions 321a and 321b are formed of n-type impurity diffusion regions and are spaced from each other to define a channel region therebetween. Gate electrode 315 is opposed to the channel region with the gate insulating layer therebetween.

Gate electrode layers 315 of access transistors Q3 and Q4 are formed of a single conductive layer, and are integral with the gate electrode layers of a pair of memory cells aligned laterally (i.e., in the row direction indicated by arrow X) to each other, forming the word line.

Drain region 311b of driver transistor Q1 and source/drain region 311b of access transistor Q3 are formed of a single n-type diffusion region. Source region 311c of driver transistor Q1 and source region 311e of driver transistor Q2 are connected together via an n-type impurity diffusion region 311f, and are formed of a single n-type diffusion region.

Gate electrode layer 325a of driver transistor Q1, gate electrode layer 325b of driver transistor Q2, gate electrode layers 315 of access transistors Q3 and Q4 are formed of composite films, each of which is made of polycrystalline silicon doped with impurity (will be referred to as "doped polycrystalline silicon" hereinafter) and high melting point silicide, and are formed of electrically conductive layers located at the same level. Isolating oxide films are formed at portions other than the n-type diffusion regions and channel regions.

Referring to FIG. 26, gate electrode layers 325a, 325b and 315 are covered with an insulating layer (not shown). This insulating layer is provided with contact holes 331h, 333h and 331i. Contact hole 331h reaches portions of gate electrode layer 325a and n-type diffusion region 321b. Contact hole 333h reaches portions of gate electrode layer 325b and n-type diffusion region 333. Contact holes 331h and 333h are so-called shared direct contact holes. Contact hole 331i reaches n-type diffusion region 311d.

A first doped polycrystalline silicon layer 331 is in contact with gate electrode layer 325a of n-type diffusion region 321b through contact hole 331h, and is also in contact with drain region 311d of driver transistor Q1 through contact hole 331i. A second doped polycrystalline silicon layer 333 is in contact with source/drain region 311b of access transistor Q3 and gate electrode layer 325b through contact hole 333h.

Referring to FIG. 27, first and second doped polycrystalline silicon layers 331 and 333 are covered with an insulating layer (not shown). This insulating layer is provided with apertures 341i and 341h which exposes portions of the surfaces of first and second doped polycrystalline silicon layers 331 and 333. There is also provided a resistance layer 341 made of polycrystalline silicon, which is in contact with second doped polycrystalline silicon layer 333 via aperture 341h and is in contact with first doped polycrystalline silicon layer 331 via aperture 341i.

Resistance layer 341 has regions 341a, 341c and 341e, which are doped with n-type impurity and will be referred as "doped regions" hereinafter, and regions 341b and 341d which are not doped with impurity and will be referred to as "non-doped regions" hereinafter. Doped regions 341a and 341c are in contact with second and first doped polycrystalline silicon layers 333 and 331 via apertures 341h and 341i, respectively. Non-doped regions 341b and 341d extend in the same direction from doped regions 341a and 341c, respectively. Non-doped regions 341b and 341d have a high resistance value and form high resistances R1 and R2, respectively. Doped region 341e is connected to ends of non-doped regions 341b and 341d, and is utilized as a $V_{cc}$ interconnection of the memory cell.

Referring to FIG. 28, resistance layer 341 is covered with an insulating layer (not shown). This insulating layer is provided with contact holes 351h and 351i which reach portions of the surfaces of source/drain regions 311a and 321a of access transistors Q3 and Q4, respectively. Aluminum (Al) interconnection layers 351a and 351b are in contact with source/drain regions 311a and 321a through contact holes 351h and 351i, respectively. Aluminum interconnection layers 351a and 351b are used as bit lines.

The conventional memory cell structure shown in FIG. 25 is disclosed, for example, in TOMOHISA et al., IEEE JOURNAL OF SOLID-STATE CIRCUITS, VOL.SC-22, NO. 5, OCTOBER 1987, pp. 727–732.

The conventional SRAM has the memory cell structure described above. However, it is difficult to reduce (1) a longitudinal size and (2) a lateral size of the memory cell structure of the conventional SRAM, so that high integration of the structure is difficult. This will be described below in detail.

(1) Longitudinal Size

Referring to FIG. 25, source region 311c of driver transistor Q1 and source region 311e of driver transistor Q2 are connected together via n-type diffusion region 311f in the conventional memory cell structure. Due to provision of n-type diffusion region 311f in this manner, a width of diffusion region 311f and a width of the isolating oxide film, which is provided for isolating diffusion region 311f from the other diffusion regions, are essential. Therefore, a total width $Lv_1$ of diffusion region 311f and isolating oxide film increases a longitudinal size $Lv_0$ (i.e., size in the column direction indicated by arrow Y) of the memory cell.

(2) Lateral Size

In the conventional memory cell structure, the gates of paired access transistors Q3 and Q4 are formed of the same conductive layer 315 and are formed integrally with the word line. Gate electrode layer 315 must be electrically isolated from gate electrode layers 325a and 325b of driver transistors Q1 and Q2 because they must be controlled independently. Taking this into consideration, it is not preferable to dispose driver transistors Q1 and Q2 at a region between access transistors Q3 and Q4, because this disposition may erroneously cause connection between gate electrode layer 315 and gate electrode layers 325a and 325b.

Driver transistor Q1 may be positioned on one side (e.g., upper side in the figure) of gate electrode 315, and driver transistor Q2 may be positioned on the other side (e.g., lower side in the figure). However, it is necessary to connect the gate of driver transistor Q1 to the drain of driver transistor Q2 and connect the gate of driver transistor Q2 to the drain of driver transistor Q1. In the above disposition, therefore, the gate electrode layers of driver transistors Q1 and Q2 inevitably cross gate electrode layers 315 of access transistors Q3 and Q4.

Even if the mutual crossing of the gate electrode layers were avoided, it would be necessary to provide an extended diffusion region which forms connection between the source regions of driver transistors Q1 and Q2. Therefore, it would be necessary to ensure a large width for the provision of the extended diffusion region as well as a region for isolating it from the other diffusion regions, resulting in disadvantageous increase of the size.

By the above reason, it is desirable to disposed driver transistors Q1 and Q2 at the same side of gate electrode layer 315. Consequently, if the gates of access transistors Q3 and Q4 are formed of the same conductive layer, it is preferable to employ the structure shown in FIG. 25 when taking the high integration and others into consideration.

In the structure shown in FIG. 25, therefore, driver transistor Q2 is aligned longitudinally (in the column direction indicated by arrow Y) to access transistor Q3, and access transistor Q4 is aligned laterally (in the row direction indicated by arrow X) to access transistor Q3. Also, with respect to driver transistor Q1, access transistor Q4 is longitudinally aligned and driver transistor Q2 is laterally aligned. Therefore, driver transistor Q1 and access transistor Q3 are diagonally aligned to each other, and driver transistor Q2 and access transistor Q4 are diagonally aligned to each other.

Due to the above disposition, it is necessary to extend diagonally the diffusion region for making connection between source/drain region 311b of access transistor Q3 and drain region 311 of driver transistor Q1. In this case, a size between driver transistors Q1 and Q2 contains a width $W_1$ of the isolating oxide film and a width $W_2$ of the diffusion region. As a result, the memory cell has a large lateral size $L_H$, which is larger by width $W_2$ of the diffusion region than that in the case where the size between driver transistors Q1 and Q2 is equal to the width of the isolating oxide film.

By the reasons stated with respect to above (1) and (2), it is difficult to reduce the longitudinal and lateral sizes according to the conventional memory cell structure. Therefore, it is difficult to reduce a planar layout area for high integration.

Prior art references such as S. Schuster et al., 1984 IEEE INTERNATIONAL SOLID-STATE CIRCUITS CONFERENCE DIGEST OF TECHNICAL PAPERS, pp. 226–227 and Japanese Patent Publication No. 3-73146 (1991) have disclosed structures which are more suitable to high integration than the memory cell structure already described. The memory cell structure of SRAM disclosed in the former prior art reference will be described below.

FIG. 29 is a schematic plan showing a section of the memory cell structure of the SRAM disclosed in the former prior art reference. FIG. 29 corresponds to the plan of FIG. 25. Thus, FIG. 29 shows structures of driver transistor pair Q1 and Q2 as well as access transistor pair Q3 and Q4 which form the memory cell structure of SRAM.

As compared with the prior art already described, the memory cell structure shown in FIG. 29 has distinctive features that (i) access transistors Q3 and Q4 are provided with independent word lines, i.e., word lines of a so-called split word line structure, and (ii) source regions 411c and 421c of driver transistors Q1 and Q2 are not connected together by a diffusion region.

The memory cell structure employs the split word line structure. This gives greater freedom of disposition of access transistors Q3 and Q4 as compared with the conventional memory cell structure.

More specifically, since word lines 415a and 415b which form the gate electrode layers of access transistors Q3 and Q4 are independent from each other, it is not necessary to juxtapose access transistors Q3 and Q4. Therefore, it is possible to disposed a drain region 411b of driver transistor Q1 and source/drain region 411b of access transistor Q3 at positions allowing easy connection. Also, a drain region 421b of driver transistor Q2 and source/drain region 421b of access transistor Q4 can be disposed at positions allowing easy connection.

Accordingly, it is not necessary to employ the conventional structure shown in FIG. 25 in which the diffusion region extends diagonally for making the connection between the source/drain region of access transistor Q3 (or Q4) and the drain region of driver transistor Q1 (or Q2). Since the diffusion region does not extend diagonally, a size $W_3$ between driver transistors Q1 and Q2 can be equal to the width of the isolating oxide film. Therefore, it is possible to reduce the lateral size of the planar layout of the memory cell.

GND lines 431a and 431b are connected to source regions 411c and 421c of driver transistors Q1 and Q2 through contact holes 431a and 431b. These GND lines 431a and 431b connect source regions 411c and 421c to the ground potential, respectively. Therefore, it is not necessary in this SRAM memory cell structure to use the diffusion region four connecting source regions 411c and 421c of driver transistors Q1 and Q2. Consequently, the width of the diffusion region and the width of the isolating oxide film for isolating this diffusion region from other diffusion regions are eliminated. Accordingly, the longitudinal size of the planar layout of the memory cell can be reduced by a value corresponding to the eliminated widths.

In this memory cell structure, however, the gate electrodes (word lines) of access transistors Q3 and Q4 are independent from each other. Therefore, a width of one word line as well as a width by which the word line is spaced from other conductive layers including the gate electrode layer of the driver transistor and others are added to the size of the memory cell structure shown in FIG. 25. Therefore, the longitudinal size of the planar layout of the memory cell structure shown in FIG. 29 is substantially equal to the size of the conventional memory cell structure shown in FIG. 25.

As described above, the memory cell structure in FIG. 29 can reduce at least the lateral size of the planar layout as compared with the conventional structure.

However, the memory cell structure is similar to the conventional structure in connection with the following points (a) and (b). (a) Gate electrode layers 415a and 415b extend between a plurality of memory cells aligned in the row direction so as to function as the word line by themselves. (b) Gate electrode layers 415a and 415b as well as gate electrode layers 425a and 425b are formed by patterning the same layer. Therefore, the memory cell structure shown in FIG. 29 is not suitable to the further integration as will be described below.

FIG. 30 is a plan of a structure corresponding to two bits for showing the fact that the memory cell structure in FIG. 29 is not suitable to the higher integration. Referring to FIG. 30, each of gate electrode layers 415a and 415b extends across the memory cell region in the lateral direction indicated by arrow X. Therefore, the longitudinal size (in the direction indicated by arrow Y) of the planar layout of the memory cell essentially contains widths $L_h$ of gate electrode layers 415a and 415b.

Since gate electrode layers 425a and 425b of driver transistors Q1 and Q2 must be controlled independently from gate electrode layers 415a and 415b of access transistors Q3 and Q4, they must be isolated from each other. Gate electrode layers 415a and 415b are formed by patterning the same layer as gate electrode layers 425a and 425b. Therefore, a width $L_g$ for isolation is required for separating and isolating gate electrode layers 415a and 415b from gate electrode layers 425a and 425b, respectively. Accordingly, the longitudinal size of the planar layout of the memory cell contains a width $L_g$ by which each of gate electrode layers 415a and 415b is spaced and isolated from the gate electrode layers 425a or 425b.

As described above, the memory cell structure shown in FIG. 29 essentially requires the widths $L_h$ of gate electrode layers (word lines) 415a and 415b and the widths $L_g$ for separating and isolating them. Accordingly, this memory cell structure is not necessarily suitable to the higher integration.

SUMMARY OF THE INVENTION

An object of the invention is to provide a memory cell structure of an SRAM which has a small planar layout area and is suitable to high integration.

A semiconductor memory device of an aspect of the invention, which includes a static memory cell having an access transistor pair and a driver transistor pair located in a memory cell region, includes a semiconductor substrate, a first access transistor, a second access transistor, a first driver transistor, a second driver transistor, an insulating layer and a conductive layer. The semiconductor substrate has a main surface. The first access transistor has a gate electrode layer formed on the main surface of the semiconductor substrate with a gate insulating film therebetween. The second access transistor has a gate electrode layer which is formed on the main surface of the semiconductor substrate with a gate insulating film therebetween and is isolated from the gate electrode layer of the first access transistor. The first driver transistor has a gate electrode layer formed on the main surface of the semiconductor substrate with a gate insulating film therebetween. The second driver transistor has a gate electrode layer formed on the main surface of the semiconductor substrate with a gate insulating film therebetween. The insulating layer is formed over and around the gate electrode layer of each transistor, and has a first contact hole reaching a top surface of the gate electrode layer of the first access transistor and a second contact hole reaching a top surface of the gate electrode layer of the second access transistor. The conductive layer is formed on the insulating layer, and is connected to the gate electrode layers of the first and second access transistors via the first and second contact holes.

According to the above aspect, the conductive layer, which is formed on the insulating layer and is connected to the gate electrode layers of the first and second access transistors, can be used, for example, as a word line. According to this structure, it is not necessary to use the gate electrode layer itself as the word line. Therefore, it is necessary to dispose each gate electrode layer only at a position opposed to a channel region of the access transistor. Conversely, if the gate electrode layer were used as the word line, it would be necessary to extend the word line across the memory cell. Thus, according to the structure not using the gate electrode layer as the word line, it is not necessary to extend the gate electrode layer across the memory cell, so that a planar area occupied by the gate electrode layer in the memory cell can be reduced. Accordingly, it is possible to reduce the planar layout area of the memory cell correspondingly to the reduction of the area of the gate electrode layer.

In general, the gate electrode layers of the first and second driver transistors as well as the gate electrode layers of the first and second access transistors are formed by patterning the same layer. In the memory cell structure of SRAM, the gate electrode layers of the driver transistor and access transistor must be isolated from each other for independent control of gates of these transistors. According to the invention of the above aspect, since the planar area occupied by the gate electrode layer in the access transistor is reduced, the gate electrode layer of driver transistor can be disposed more freely. This also enables reduction of the planar layout area of the memory cell.

A semiconductor memory device according to another aspect of the invention has a plurality of memory cells, a plurality of word lines and a plurality of bit line pairs. The plurality of memory cells are arranged in rows and columns on a main surface of a semiconductor substrate, and each have a first driver transistor, a second driver transistor, a first access transistor and a second access transistor. The first driver transistor has a pair of source/drain regions formed at the main surface of the semiconductor substrate, and a gate electrode layer formed on a portion of the main surface of the semiconductor substrate between the source/drain regions with a gate insulating film therebetween. The second driver transistor has a pair of source/drain regions formed at the main surface of the semiconductor substrate, and a gate electrode layer formed on a portion of the main surface of the semiconductor substrate between the source/drain regions with a gate insulating film therebetween. The first access transistor has a pair of source/drain regions formed at the main surface of the semiconductor substrate, and a gate electrode layer formed on a portion of the main surface of the semiconductor substrate between the source/drain regions with a gate insulating film therebetween. The second access transistor has a pair of source/drain regions formed on the main surface of the semiconductor substrate, and a gate electrode layer formed on a portion of the main surface of the semiconductor substrate between the source/drain regions with a gate insulating film therebetween. The gate electrode layers of the first and second driver transistors and the first and second access transistors are formed at a common first conductive layer and are isolated from each other. The plurality of word lines are arranged in a plurality of rows, and each have a first word line conductive layer and a second word line conductive layer. The first word line conductive layer is formed at a layer above the gate electrode layer of the access transistor of the memory cell, and is electrically connected to the gate electrode layers of the first access transistors in the plurality of memory cells arranged in the corresponding row. The second word line conductive layer is formed at a level above the gate electrode layer of the access transistor of the memory cell, and is electrically connected to the gate electrode layers of the second access transistors in the plurality of memory cells arranged in the corresponding row. The conductive layers for the first and second word lines are electrically connected together, and are formed of a common second conductive layer. The plurality of bit line pairs are arranged in a plurality of columns, and each have a first bit line and a second bit line. The first bit line is formed at a layer above the gate electrode layer of the access transistor of the memory cell, and is electrically connected to one of the source/drain regions of each of the first access transistors in the plurality of memory cells arranged in the corresponding column. The second bit line is formed at a layer above the gate electrode layer of the access transistor of the memory cell, and is electrically connected to one of the source/drain regions of each of the second access transistors in the plurality of memory cells arranged in the corresponding column. The first and second bit lines are formed of a third conductive layer different from the second conductive layer.

According to another aspect of the invention, the first word line conductive layer, which is formed at the level above the gate electrode layer of the access transistor, serves as the word line. Therefore, it is not necessary to use the gate electrode layer itself as the word line. Accordingly, it is necessary to provide the gate electrode layer only at a region opposed to the channel region of the access transistor. Meanwhile, if the gate electrode layer were used as the word line, it would be necessary to extend the word line across the memory cell. Thus, if the gate electrode layer is not used as the word line, it is not necessary to provide the gate electrode layer extending across the memory cell, so that it is possible to reduce the planar area occupied by the gate electrode layer in the memory cell. Accordingly, the planar layout area of the memory cell can be reduced correspondingly to the reduction of area of the gate electrode layer.

The gate electrode layers of the first and second driver transistors and the gate electrode layers of the first and second access transistors are generally formed by patterning the same layer. In the memory cell structure of SRAM, it is necessary to isolate the respective gate electrode layers from each other for independent control of gates of the driver transistors and access transistors. According to the above aspect, since the planar area occupied by the gate electrode layer in the access transistor is reduced as described above, the gate electrode layer of the driver transistor can be disposed more freely. This also enable reduction of the planar layout area of the memory cell.

According to a semiconductor memory device of a preferred aspect of the invention, the source/drain regions of the first driver transistor in each memory cell are aligned in the row direction. The paired source/drain regions of the second driver transistor are aligned in the row direction. The paired source/drain regions of the first access transistor are aligned in the column direction such that the other one of the source/drain regions is located near a center point of the memory cell. The paired source/drain regions of the second access transistor are aligned in the column direction such that the other one of the source/drain regions is located near the center point. One of the source/drain regions, which is located near the center point, of the first driver transistor and the other one of source/drain region of the first access transistor are electrically connected together via an impurity region formed at the main surface of the semiconductor substrate. One of the source/drain regions, which is located near the center point, of the second driver transistor and the other one of source/drain region of the second access transistor are electrically connected together via an impurity region formed at the main surface of the semiconductor substrate. A line extended from the gate electrode layer of the first access transistor in the row direction crosses the gate electrode layer of the first driver transistor. A line extended from the gate electrode layer of the second access transistor in the row direction crosses the gate electrode layer of the second driver transistor.

According to the preferred aspect of the invention, since the source/drain region of one (or the other) of the access transistors forming the memory cell is formed of the same impurity region as the drain region of one (or the other) of the driver transistors, it is not necessary to provide a separating and insulating layer which is required if the above regions are formed separately from each other. Therefore, the planar layout area of the memory cell can be reduced correspondingly to elimination of the separating and isolating layer. Accordingly, the SRAM can have the memory cell structure suitable to the high integration.

In the semiconductor memory device according to another preferred aspect of the invention, the first and second word line conductive layers forming each of the word lines and the ground conductive layer each have a double layer including a polycrystalline silicon layer and a high melting point silicide layer.

In the semiconductor memory device according to the above aspect of the invention, each of the first and second word line conductive layers and the ground conductive layers is formed of the double layer including the polycrystalline silicon layer and the high melting point silicide layer. Therefore, resistances of the first and second word line conductive layers and the ground conductive layer do not exceed 15Ω/□, and thus is smaller than that of a doped polycrystalline silicon layer. Therefore, the memory cell can have improved symmetry in performance. Accordingly, stability of read operation of the memory cell can be improved.

According to the semiconductor memory device of further another preferred aspect of the invention, each memory cell has a first resistance layer and a second resistance layer. The first resistance layer is formed at a layer above the gate electrode layer of the driver transistor, and is formed of a fourth conductive layer different from the second and third conductive layers. The first resistance layer has one end, which is connected to one of the source/drain regions of the first driver transistor and the gate electrode layer of the second driver transistor, and the other end, which is connected to a power supply potential line. The second resistance layer is formed of the fourth conductive layer and has one end, which is connected to one of the source/drain regions of the second driver transistor and the gate electrode layer of the first driver transistor, and the other end, which is connected to the power supply potential line.

According to the above preferred aspect of the invention, the SRAM memory cell of a high resistance type suitable to the high integration can be obtained.

According to the semiconductor memory device of yet another preferred aspect of the invention, each memory cell has a first load transistor having a first semiconductor layer and a second load transistor having a second semiconductor layer. The first semiconductor layer is formed at a layer above the gate electrode layer of the driver transistor, and is formed of a fourth conductive layer different from the second and third conductive layers. The fourth conductive layer is provided with the paired source/drain regions, one of which is connected to one of the source/drain regions of the first driver transistor and the gate electrode layer of the second driver transistor, and the other of which is connected to a power supply potential line. The second semiconductor layer is formed of the fourth conductive layer and is provided with the paired source/drain regions, one of which is connected to the one source/drain region of the second driver transistor and the gate electrode layer of the first driver transistor, and the other of which is connected to the power supply potential line.

According to the above preferred aspect of the invention, the SRAM memory cell of a CMOS (Complementary Metal Oxide Semiconductor) type suitable to the high integration can be obtained.

The foregoing and other objects, features, aspects and advantages of the present invention will become more apparent from the following detailed description of the present invention when taken in conjunction with the accompanying drawings.

Figure 14:
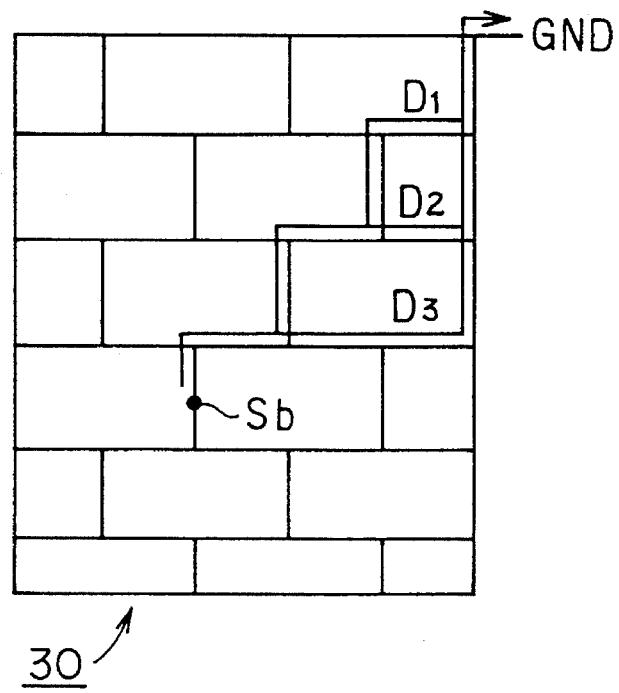
Figure 15:
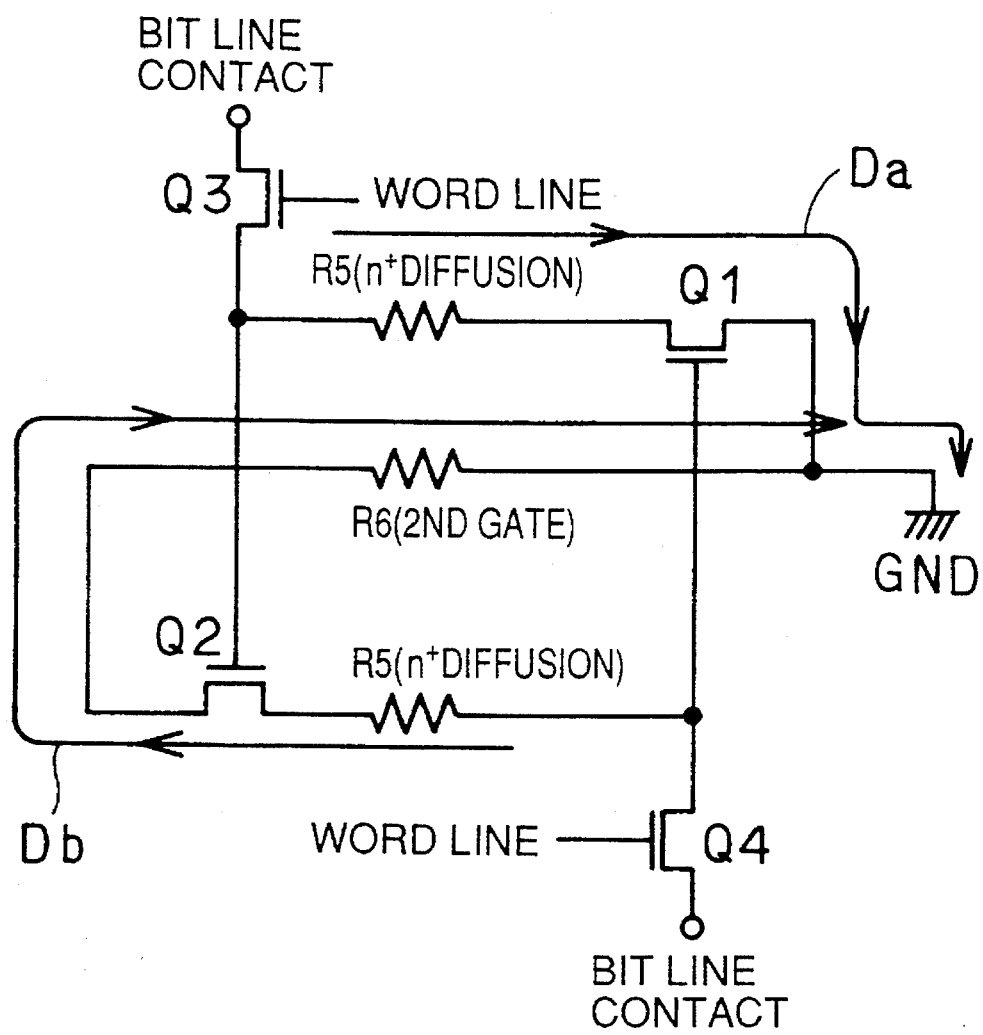
Figure 16:
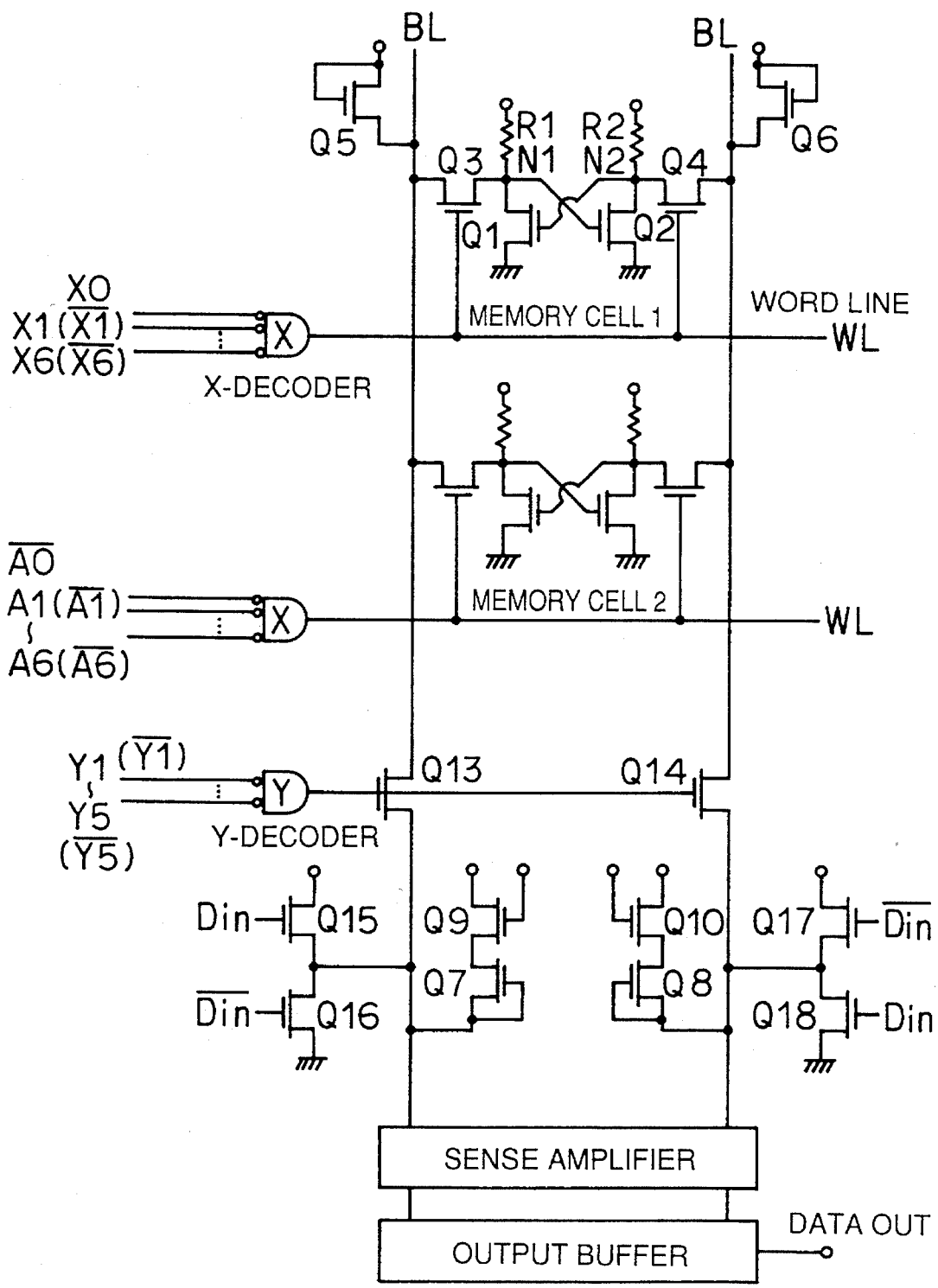
Figure 17:
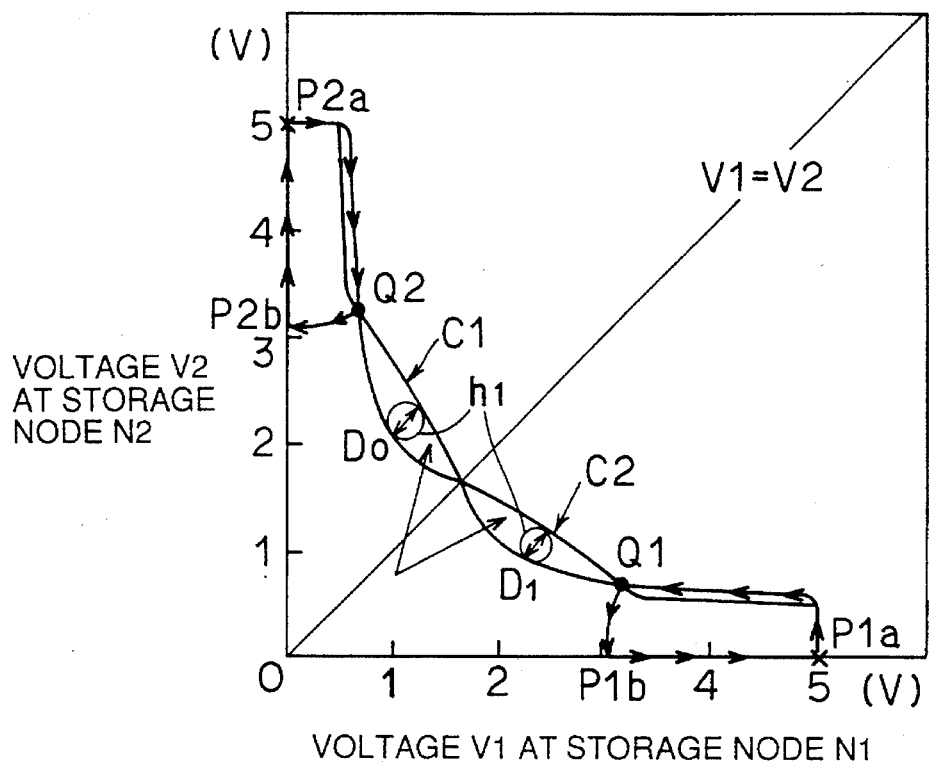
Figure 18:
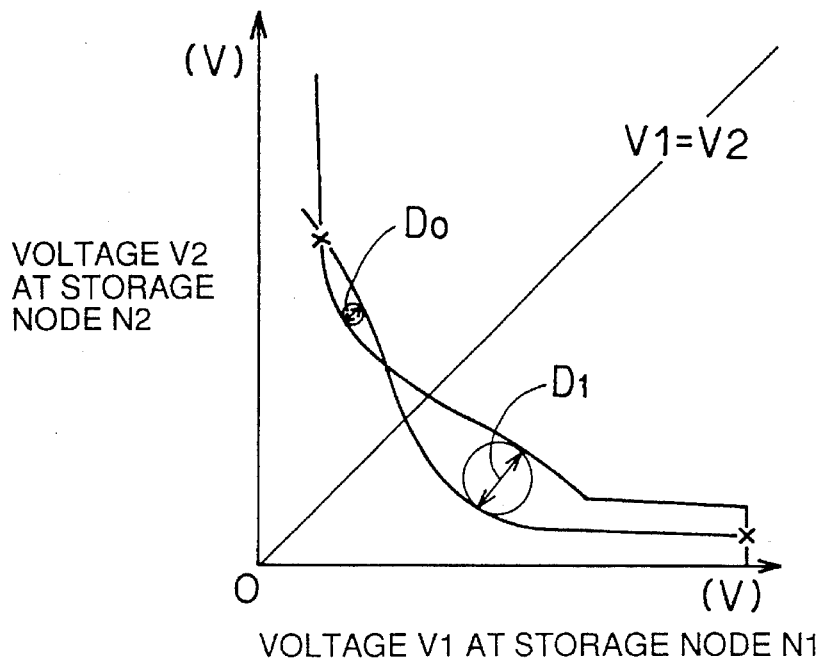
Figure 19:
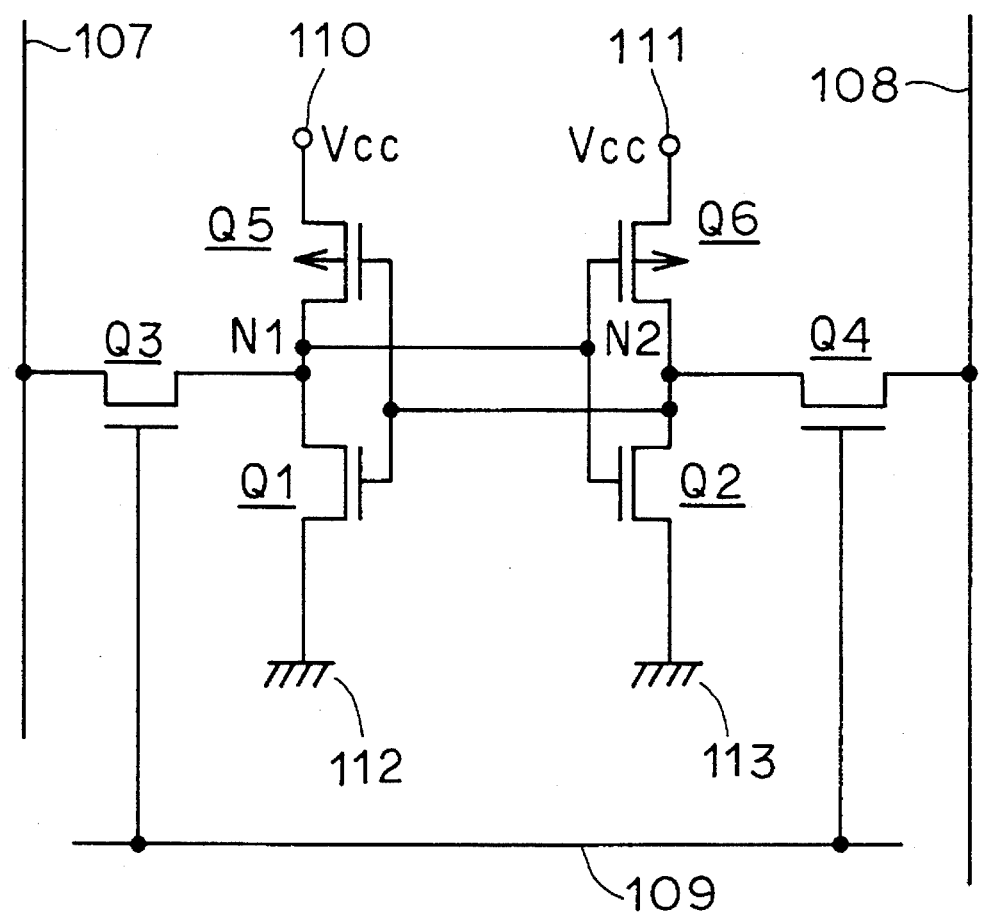
Figure 20:
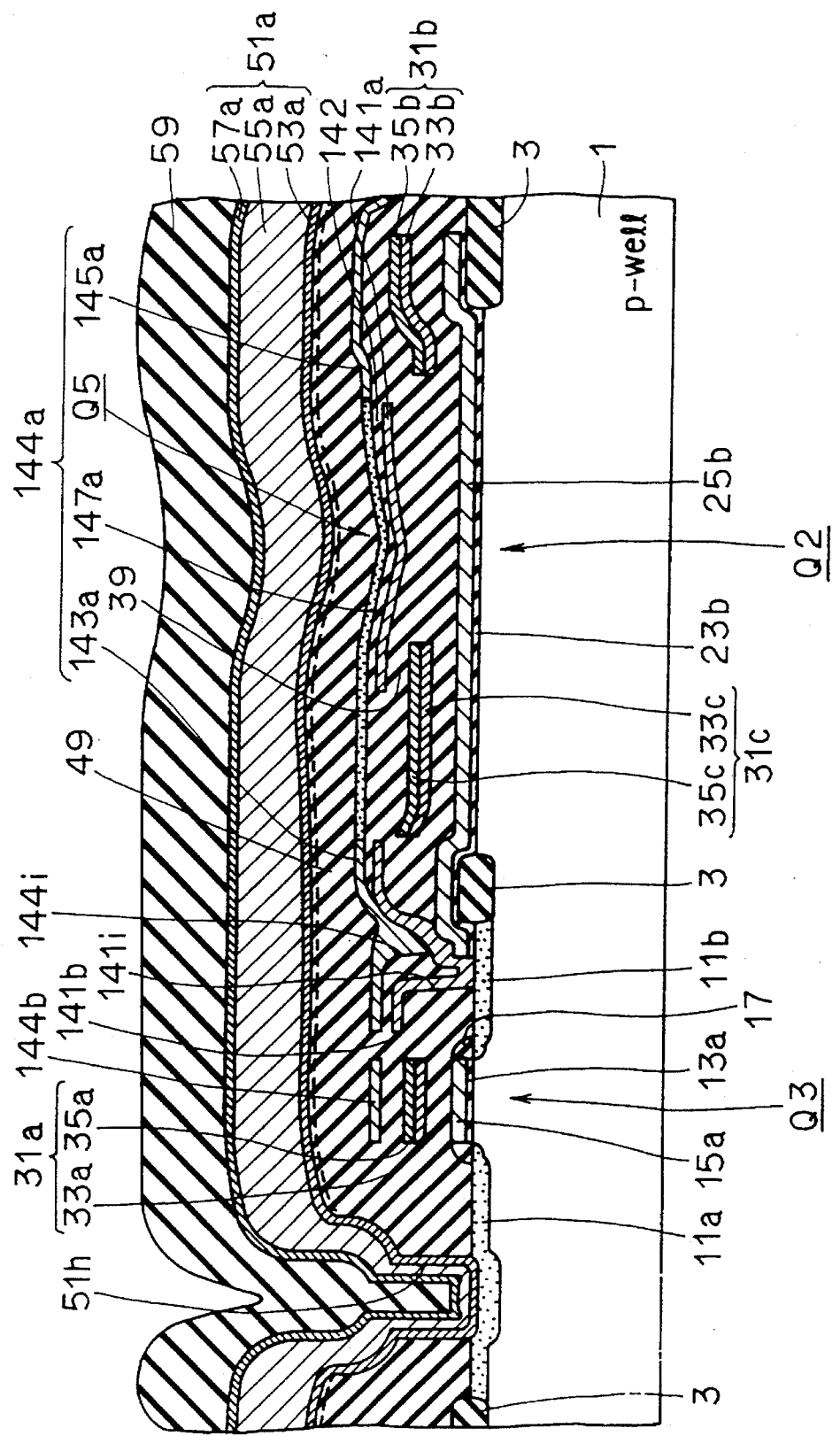
Figure 21:
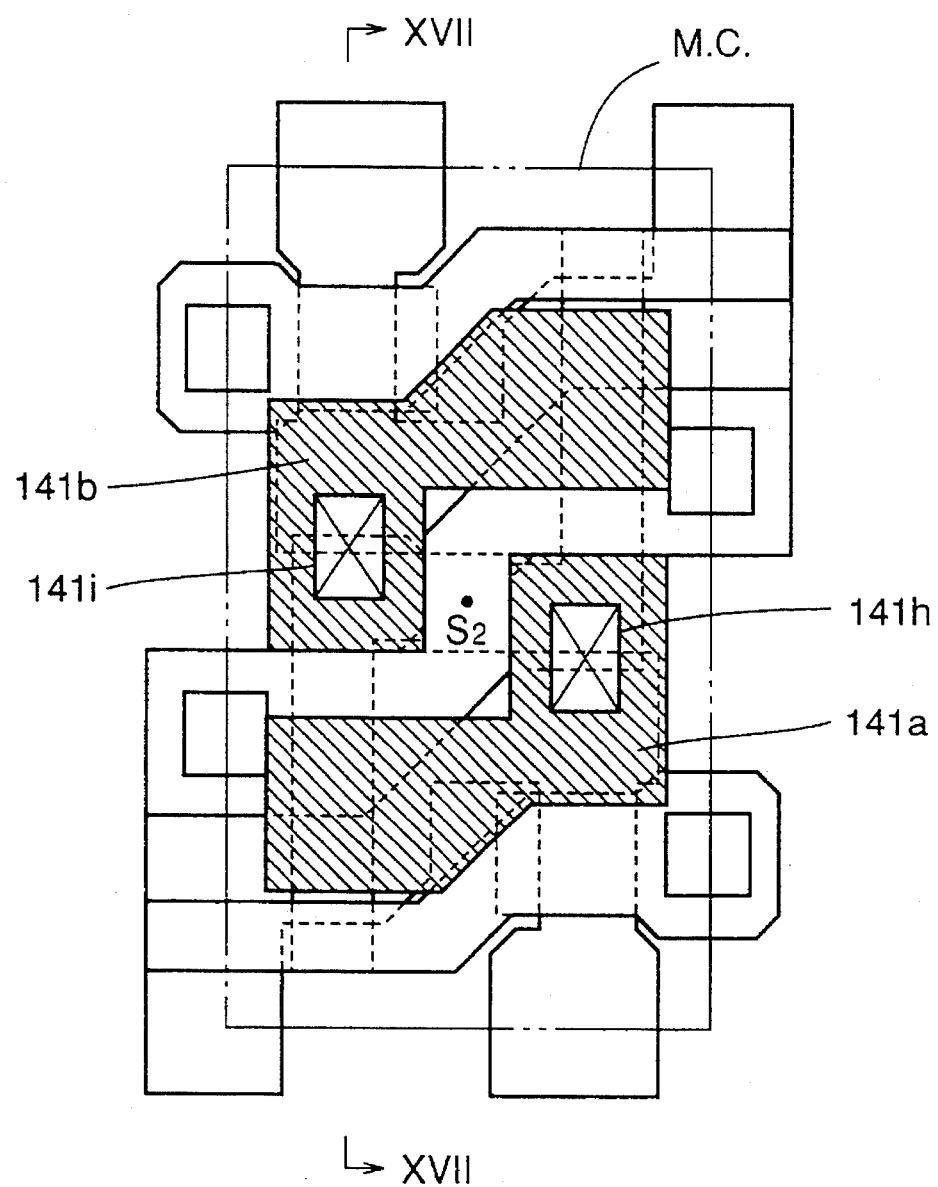
Figure 22:
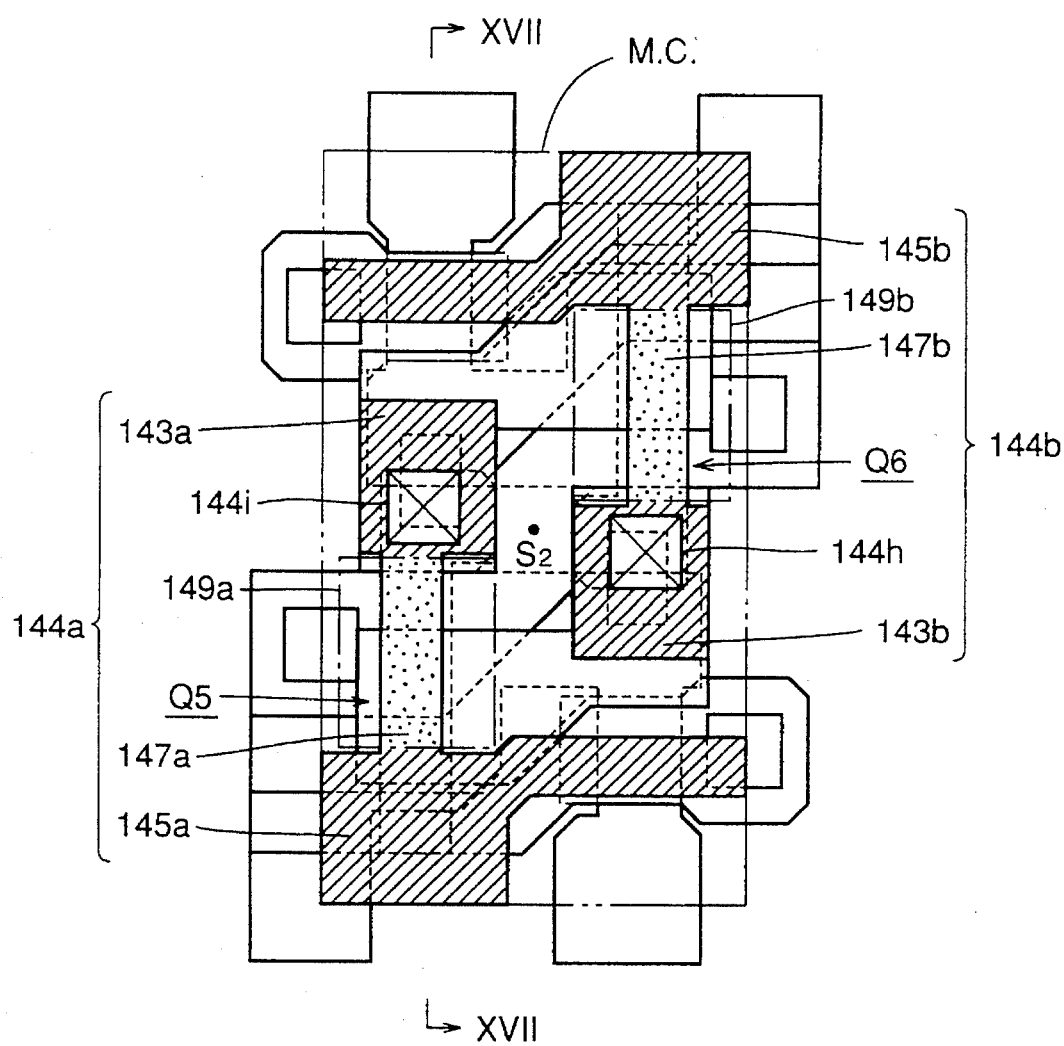
Figure 23:
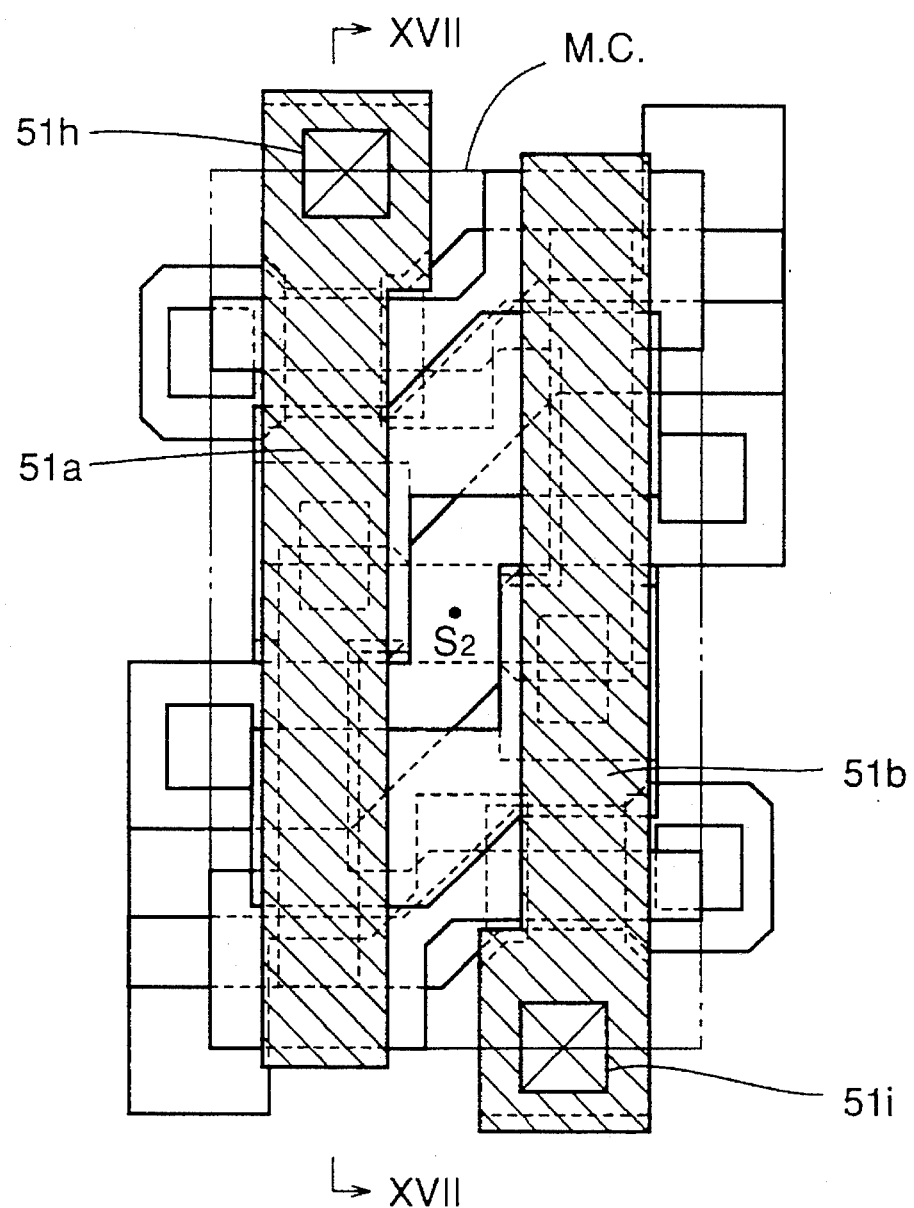
Figure 24:
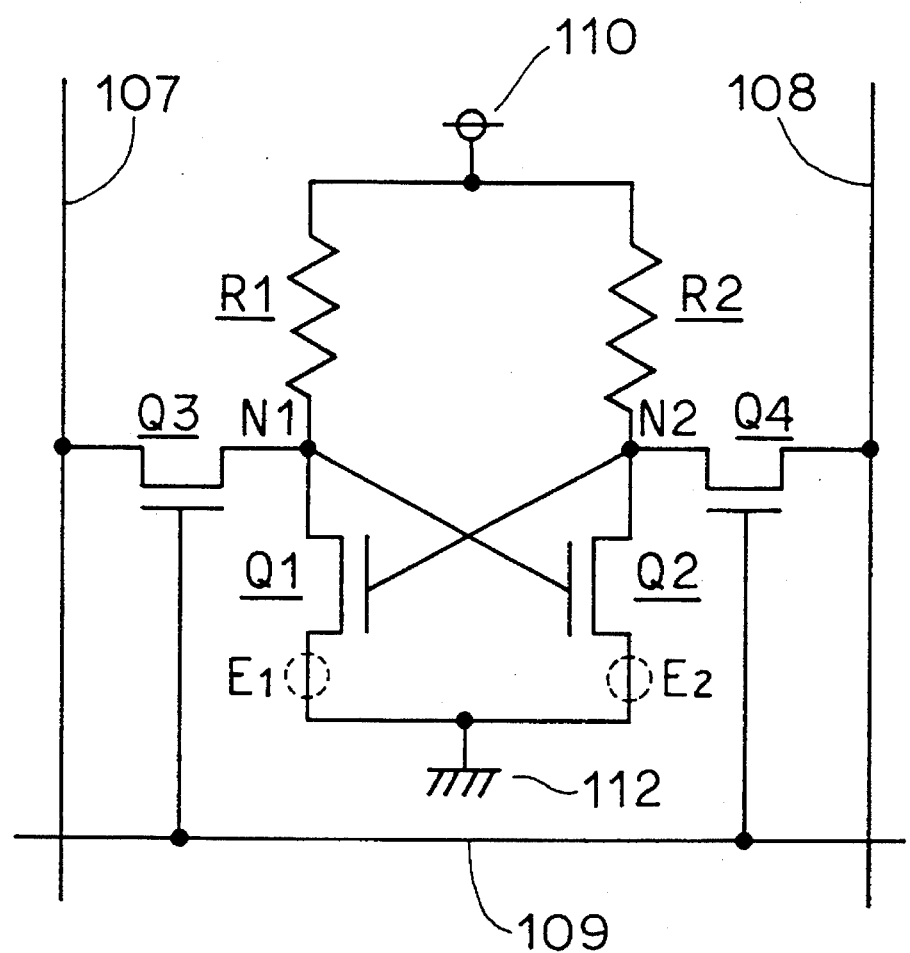
Figure 29:
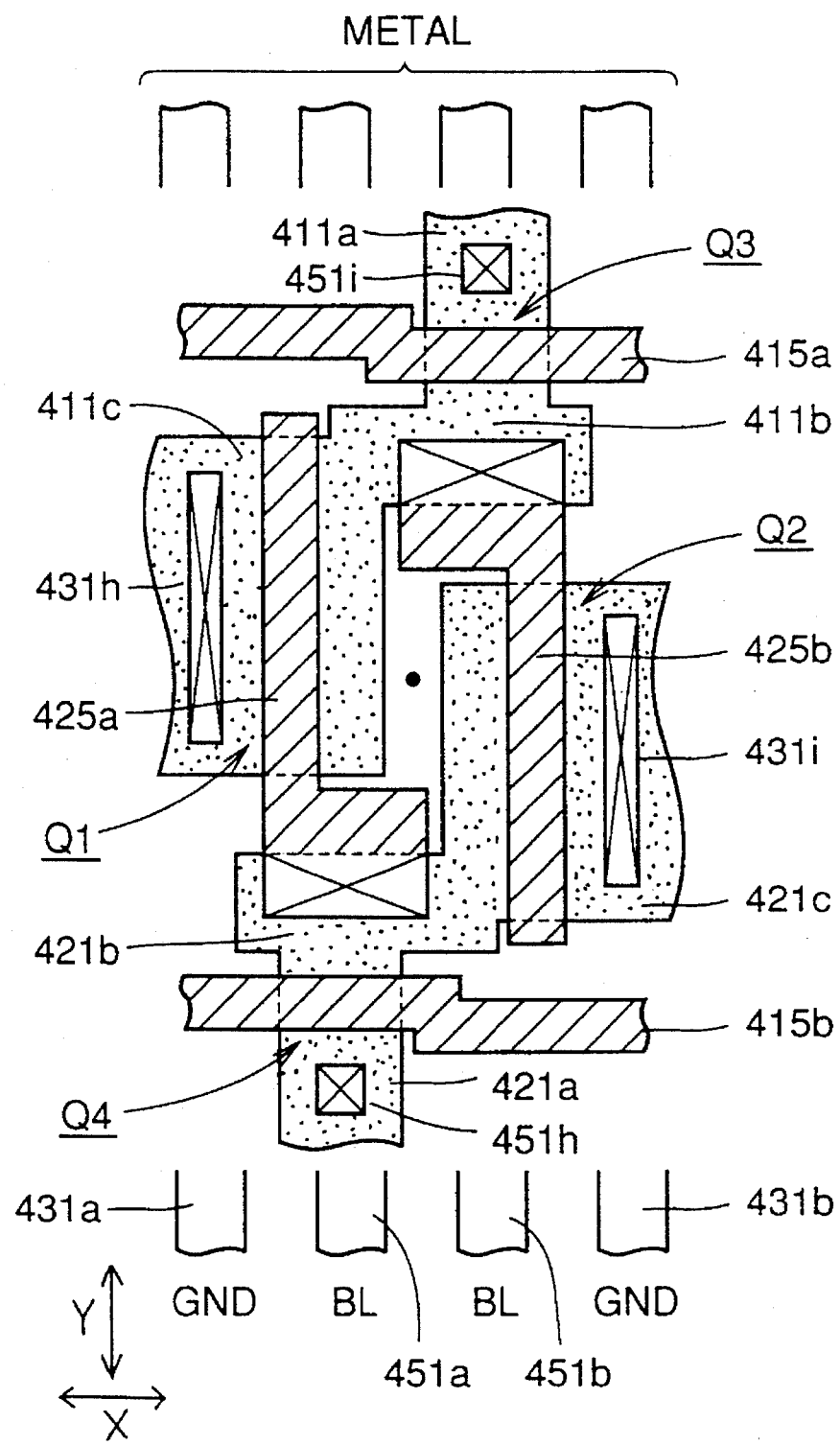
Figure 30:
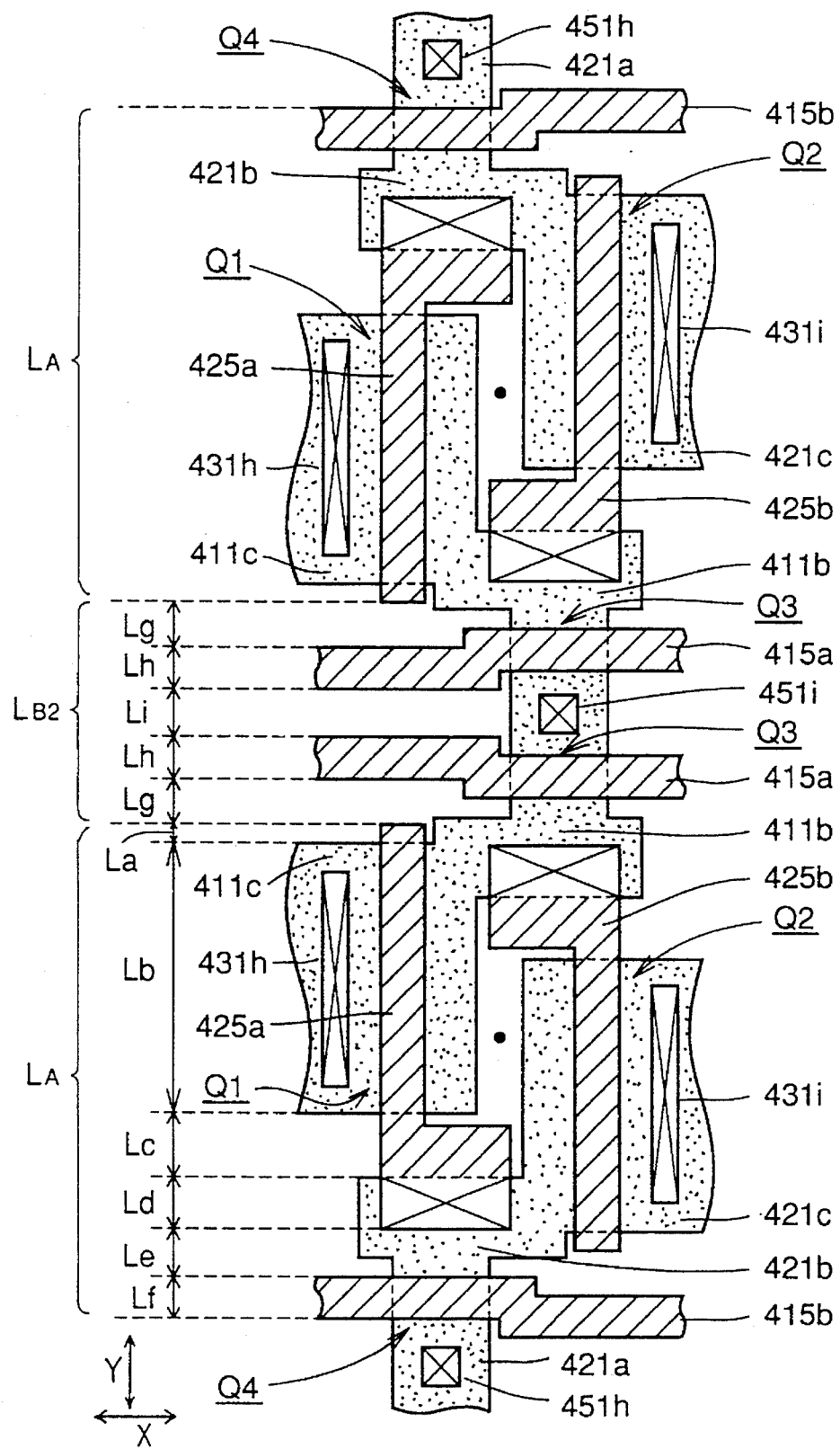

FOG. 13 is a schematic plan showing a current path in the structure including driver transistors of which source regions are connected linearly;

FIG. 14 is a schematic plan showing a current path in the structure including driver transistors of which source regions are connected in a net-like form;

FIG. 15 is an equivalent circuit diagram showing the fact that the memory cell structure of SRAM of the first embodiment of the invention cannot achieve symmetry in performance;

FIG. 16 is an equivalent circuit diagram showing the read operation of the SRAM;

FIG. 17 shows I/O transmission characteristics in the read operation in the case where the memory cell of SRAM has the symmetry performance;

FIG. 18 shows I/O transmission characteristics in the case where the memory cell structure of SRAM is asymmetrical in connection with the performance;

FIG. 19 is an equivalent circuit diagram showing a memory cell structure of an SRAM of a CMOS type;

FIG. 20 is a cross section schematically showing a memory cell structure of an SRAM of a second embodiment of the invention;

FIGS. 21 to 23 are plans showing sections of the memory cell structure of SRAM of the second embodiment according to the invention at three different levels in accordance with the order from a lowermost layer to an uppermost layer;

FIG. 24 is an equivalent circuit diagram showing a memory cell structure of an SRAM of a high resistance load type;

FIGS. 25 to 28 are plans showing sections of a memory cell structure of a conventional SRAM at four different levels in accordance with the order from a lowermost layer to an uppermost layer;

FIG. 29 is a plan showing structures of driver transistors and access transistors forming a memory cell structure of an SRAM disclosed in a prior art reference; and FIG. 30 is a plan showing structures of the driver transistors and access transistors forming the memory cell structures corresponding to two bits of the SRAM disclosed in the prior art reference.

DESCRIPTION OF THE PREFERRED EMBODIMENTS

Embodiments of the invention will be described below.

Figure 1:
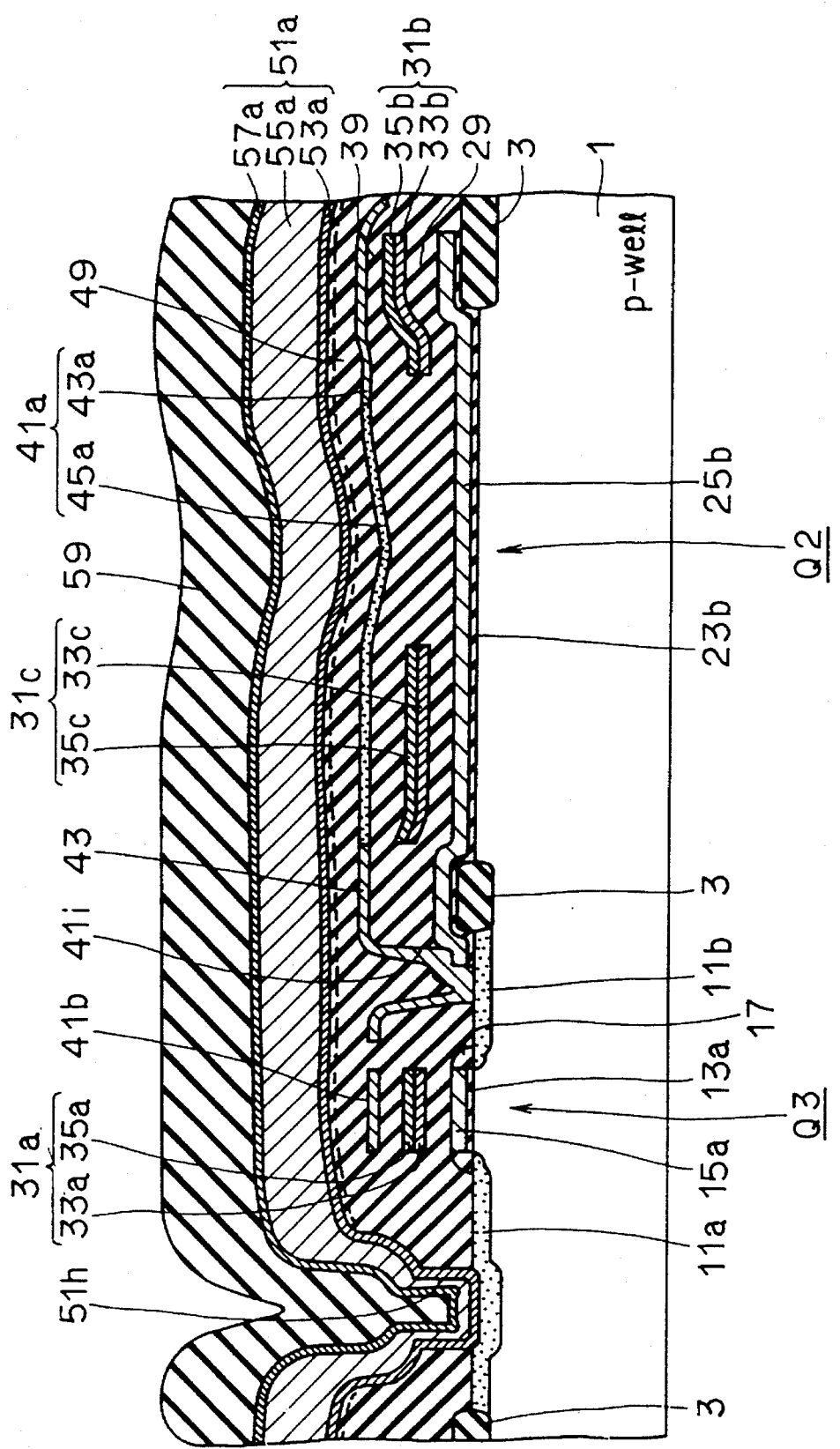
FIG. 1 is a cross section schematically showing a memory structure of an SRAM of a first embodiment of the invention.

FIG. 1 is a cross section taken along line I—I in FIGS. 2–5.

Figure 2:
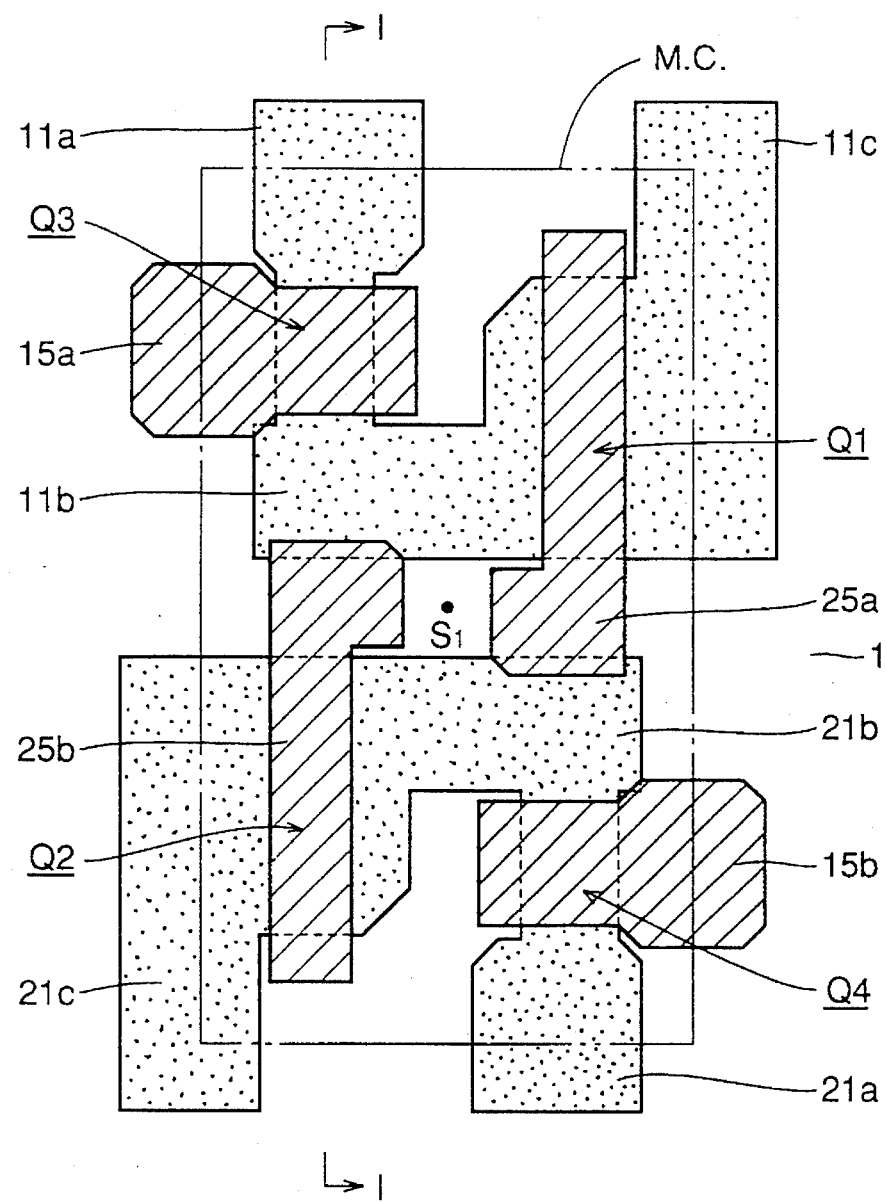
FIGS. 2 to 5 are plans showing sections of the memory cell structure of SRAM of the first embodiment according to the invention at four different levels in accordance with the orders from a lowermost layer to an uppermost layer.

Referring mainly to FIGS. 1 and 2, one memory cell is formed at a region M.C. which is surrounded by alternate long and two short clashes line in FIG. 2 and will be referred to as a memory cell region. At memory cell region M.C., there are formed a pair of driver transistors Q1 and Q2, a pair of access transistors Q3 and Q4, and a pair of high resistances R1 and R2 (FIGS. 1 and 4) which form the memory cell of the SRAM.

Driver transistor pair Q1 and Q2 and access transistor pair Q3 and Q4 are formed at a surface of a p-type well region 1 formed at a semiconductor substrate.

In FIG. 2, driver transistor Q1 has a drain region 11b, a source region 11c, a gate insulating layer (not shown) and a gate electrode layer 25a. Drain region 11b and source region 11c are formed of n-type impurity diffusion regions, and are spaced laterally in the figure (in the row direction) from each other to define a channel region therebetween. A gate electrode layer 25a extending longitudinally in the figure (in the column direction) is formed on the channel region defined between drain region 11b and source region 11c with a gate insulating layer therebetween.

Driver transistor Q2 has a drain region 21b, a source region 21c, a gate insulating layer 23b and a gate electrode layer 25b. Drain region 21b and source region 21c are formed of n-type impurity diffusion regions, and are spaced laterally in the figure (in the row direction) from each other to define a channel region therebetween. A gate electrode layer 25b, which extends parallel to gate electrode layer 25a, i.e., longitudinally in the figure, is formed on the channel region defined between drain region 21b and source region 21c with a gate insulating layer 23b therebetween.

Access transistor Q3 has a pair of source/drain regions 11a and 11b, a gate insulating layer 13a and a gate electrode layer 15a. Source/drain regions 11a and 11b are formed of n-type impurity diffusion regions, and are spaced longitudinally in the figure (in the column direction) by a predetermined distance from each other to define a channel region therebetween. A gate electrode layer 15a, which extends laterally in the figure (in the row direction), is formed on the channel region defined between paired source/drain regions 11a and 11b with a gate insulating layer 13a therebetween.

Access transistor Q4 has a pair of source/drain regions 21a and 21b, a gate insulating layer (not shown) and a gate electrode layer 15b. Paired source/drain regions 21a and 21b are formed of n-type impurity diffusion regions, and are spaced longitudinally in the figure by a predetermined distance from each other to define a channel region therebetween. A gate electrode layer 15b, which is formed on the channel region defined between paired source/drain regions 21a and 21b with a gate insulating layer therebetween extends parallel to gate electrode layer 15a and perpendicularly to gate electrode layers 25a and 25b (i.e., laterally in the figure).

Gate electrode layers 25a, 25b, 15a and 15b are made of doped polycrystalline silicon layers formed at the same level.

Drain region 11b of driver transistor Q1 and source/drain region 11b of access transistor Q3 are formed of the same n-type impurity diffusion region. Drain region 21b of driver transistor Q2 and source/drain region 21b of access transistor Q4 are formed of the same n-type impurity diffusion region.

Gate electrode layers 15a and 15b of access transistors Q3 and Q4 do not extend across the memory cell region M.C., and are required only to be opposed to the corresponding channel regions of access transistors Q3 and Q4, respectively.

Driver transistor pair Q1 and Q2 and access transistor pair Q3 and Q4 have such a planar layout structure in memory cell region M.C. that they are symmetrical with respect to a point $S_1$.

Figure 6:
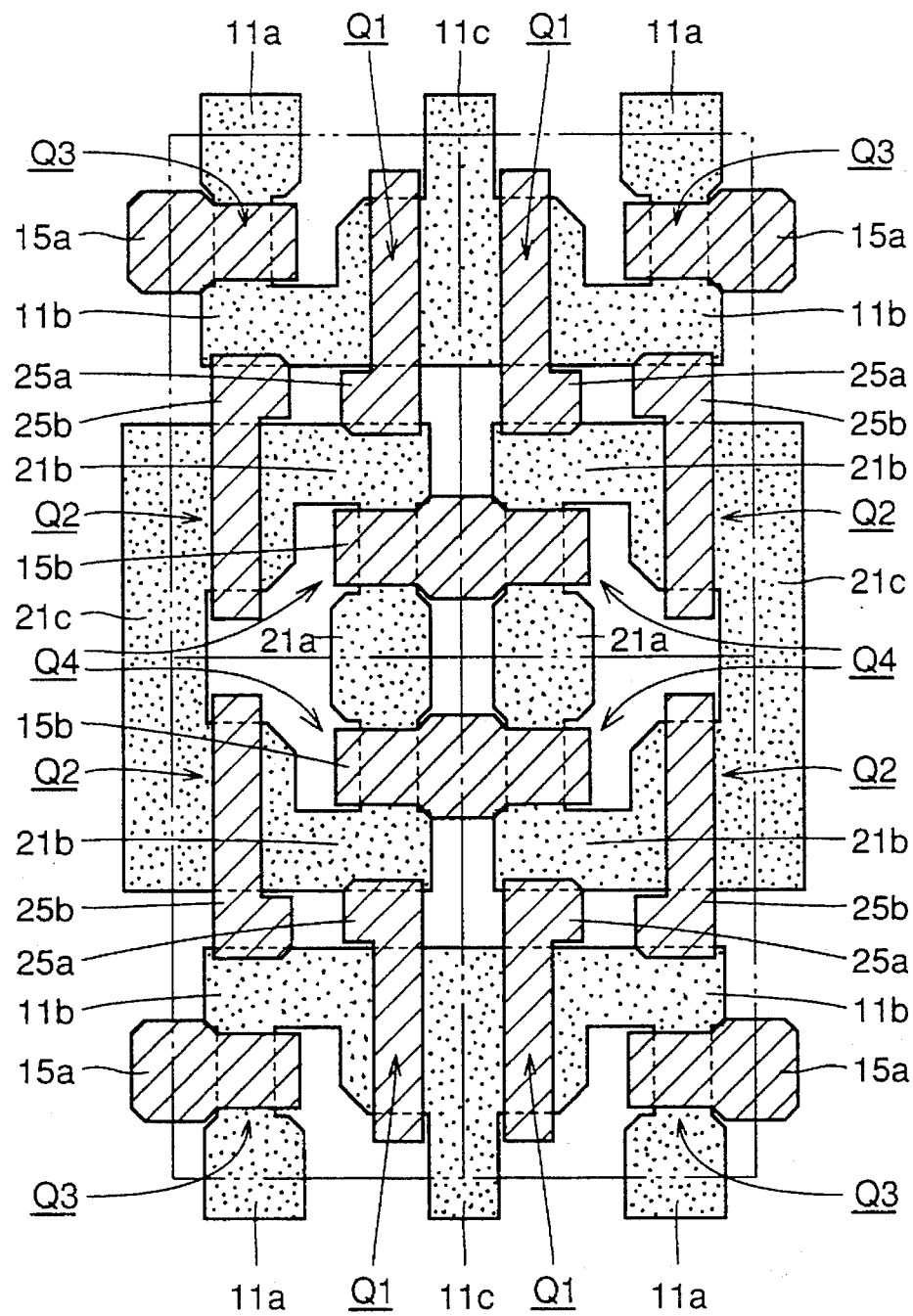
FIGS. 6 to 9 are plans showing sections of the memory cell structure of the SRAM corresponding to four bits of the first embodiment according to the invention at four different levels in accordance with the order from the lowermost layer to the uppermost layer.

Referring mainly to FIG. 6, source regions 11c and 11c of driver transistors Q1 and Q1 of memory cells, which adjoin together in the row direction (indicated by arrow X), are integral and are formed of the same n-type impurity diffusion region. The source regions of driver transistors Q2 have similar structure as the source regions of driver transistors Q1.

Source regions 11c and 11c of driver transistors Q1 and Q1 of memory cells, which adjoin together in the column direction (indicated by arrow Y), are integral and are formed of the same n-type impurity diffusion region. The source regions 21c of driver transistors Q2 have similar structure as the source regions 11c of driver transistors Q1.

Gate electrode layers 15a and 15a of access transistors Q3 and Q3 of memory cells, which adjoin together in the row direction, are integral and are formed of the same conductive layer. The gate electrode layers 15b of access transistors Q4 have similar structure as the gate electrode layers 15a of access transistors Q3.

Memory cells adjoining together in the row direction have such a structure that driver transistors Q1 and Q2 and access transistors Q3 and Q4 in one memory cell are symmetrical to those in the adjacent memory cell with respect to line. Memory cells adjoining together in the column direction have such a structure that driver transistors Q1 and Q2 and access transistors Q3 and Q4 in one memory cell are symmetrical to those in the adjacent memory cell with respect to line.

Figure 3:
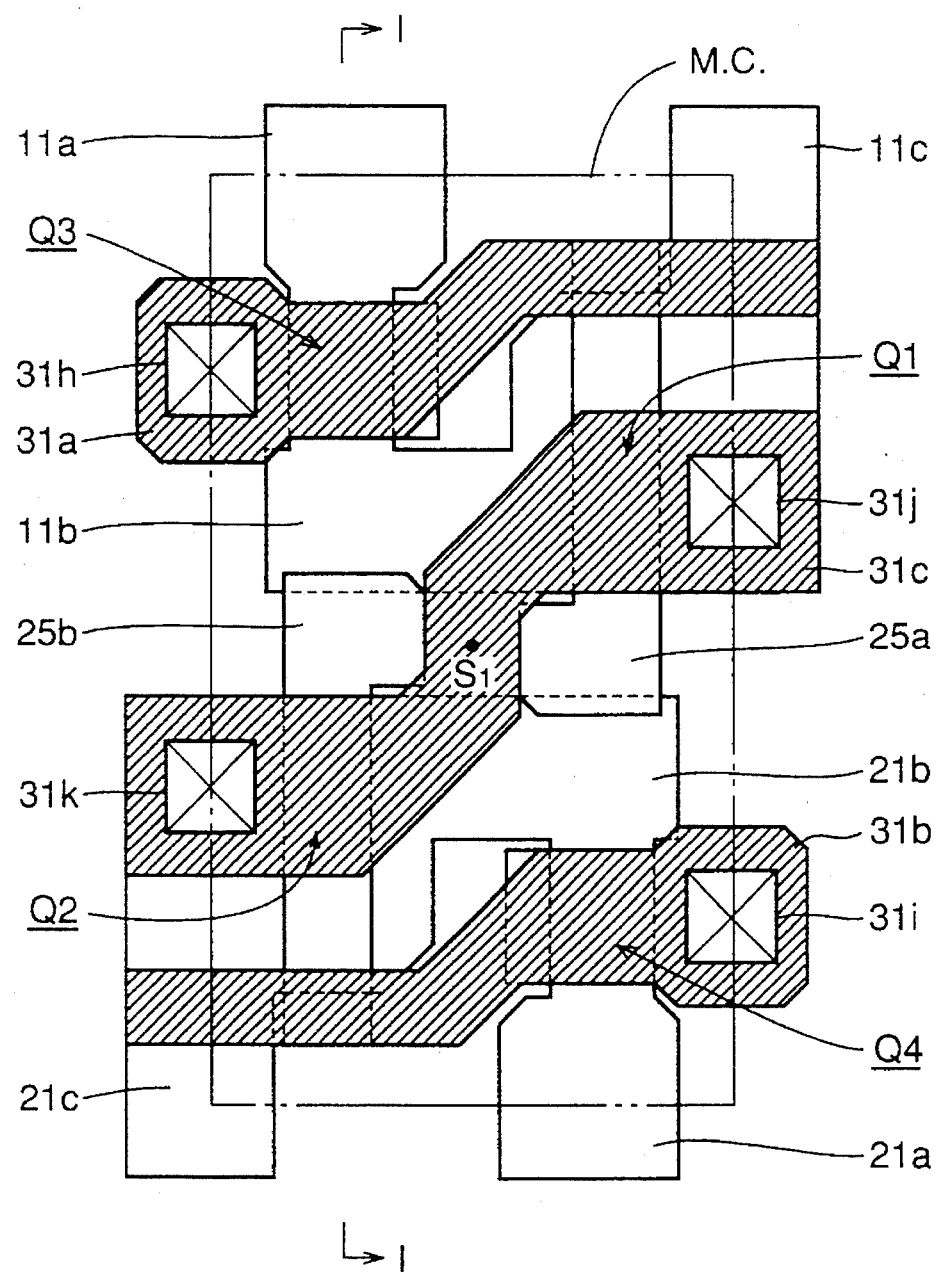

Referring mainly to FIGS. 1 and 3, driver transistor pair Q1 and Q2 and access transistor pair Q3 and Q4 are covered with an insulating layer 29 formed on the semiconductor substrate. Insulating layer 29 is provided with contact holes 31h, 31i, 31j and 31k.

A conductive layer 31a is electrically connected to gate electrode 15a of access transistor Q3 through contact hole 31h. A conductive layer 31c is electrically connected to source region 11c of driver transistor Q1 through contact hole 31j, and is also electrically connected to source region 21c of driver transistor Q2 through contact hole 31k. A conductive layer 31b is electrically connected to gate electrode layer 15b of access transistor Q4 through contact hole 31i.

Each of conductive layers 31a, 31b and 31c is formed of a composite layer, which is formed at the same layer and includes a doped polycrystalline silicon layer and a high melting point silicide layer, and has a sheet resistance from 5 to 15Ω/□. Each of conductive layers 31a, 31b and 31c extends laterally (i.e., in the row direction) across memory cell region M.C., and is parallel to the others. In particular, conductive layers 31a and 31b form the word line.

Conductive layers 31a, 31b and 31c are disposed symmetrically with respect to a point $S_1$.

Figure 7:
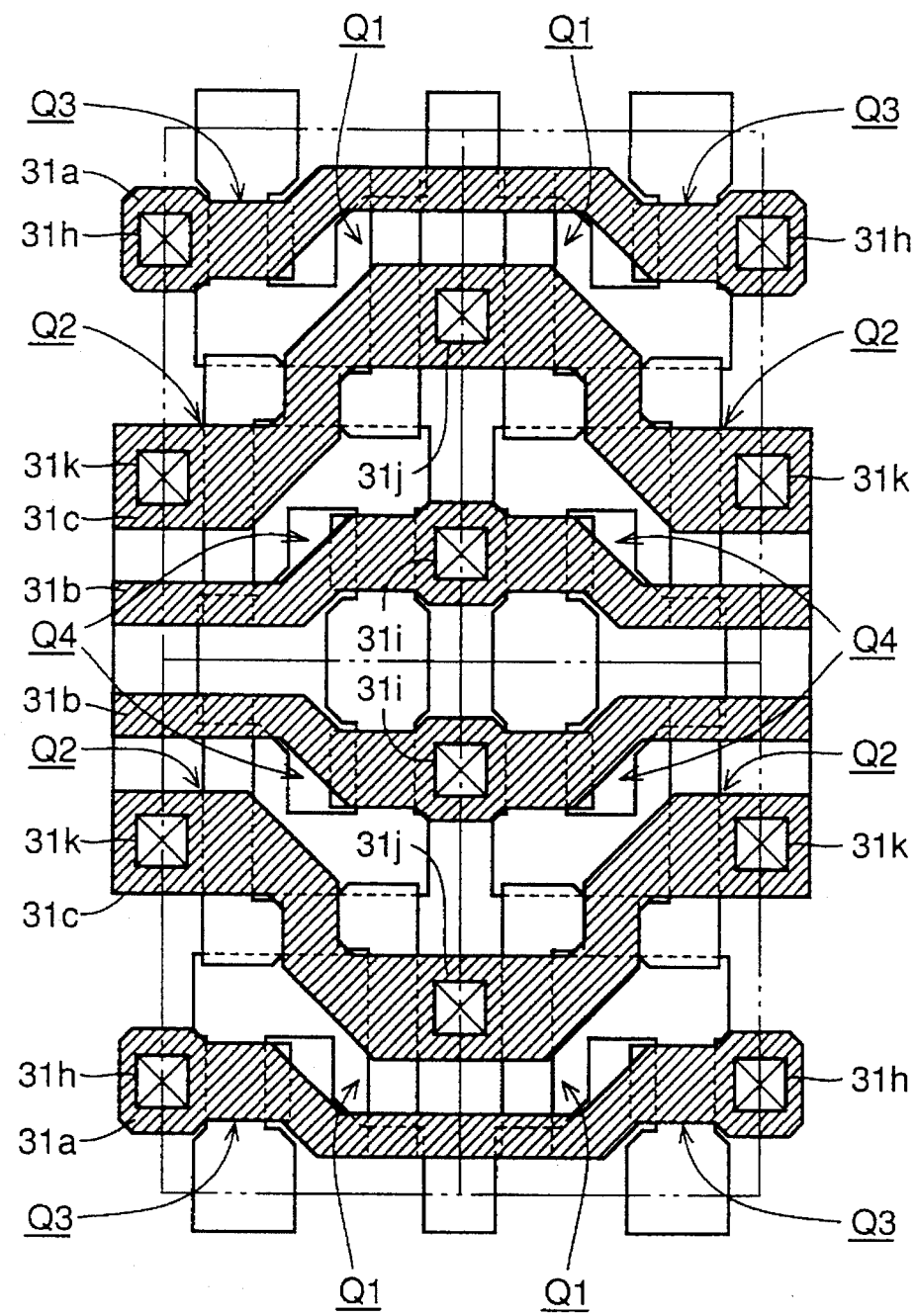

Referring mainly to FIG. 7, conductive layer 31a connects to gate electrode layers 15a of access transistors Q3 of the memory cells aligned in the row direction to each other, and thus forms a first word line. Conductive layer 31b connects to gate electrode layers 15b of access transistors Q4 of the memory cells aligned in the row direction to each other, and thus forms a second word line. Conductive layer 31c connects to source regions 11c and 21c of driver transistors Q1 and Q2 of the memory cells aligned in the row direction to each other, and thus forms a ground line.

Memory cells adjoining together in the row direction have such a structure that conductive layers 31a, 31b and 31c in one memory cell are disposed symmetrically to those in the adjacent memory cell with respect to line. Memory cells adjoining together in the column direction have such a structure that conductive layers 31a, 31b and 31c in one memory cell are disposed symmetrically to those in the adjacent memory cell with respect to line.

Figure 4:
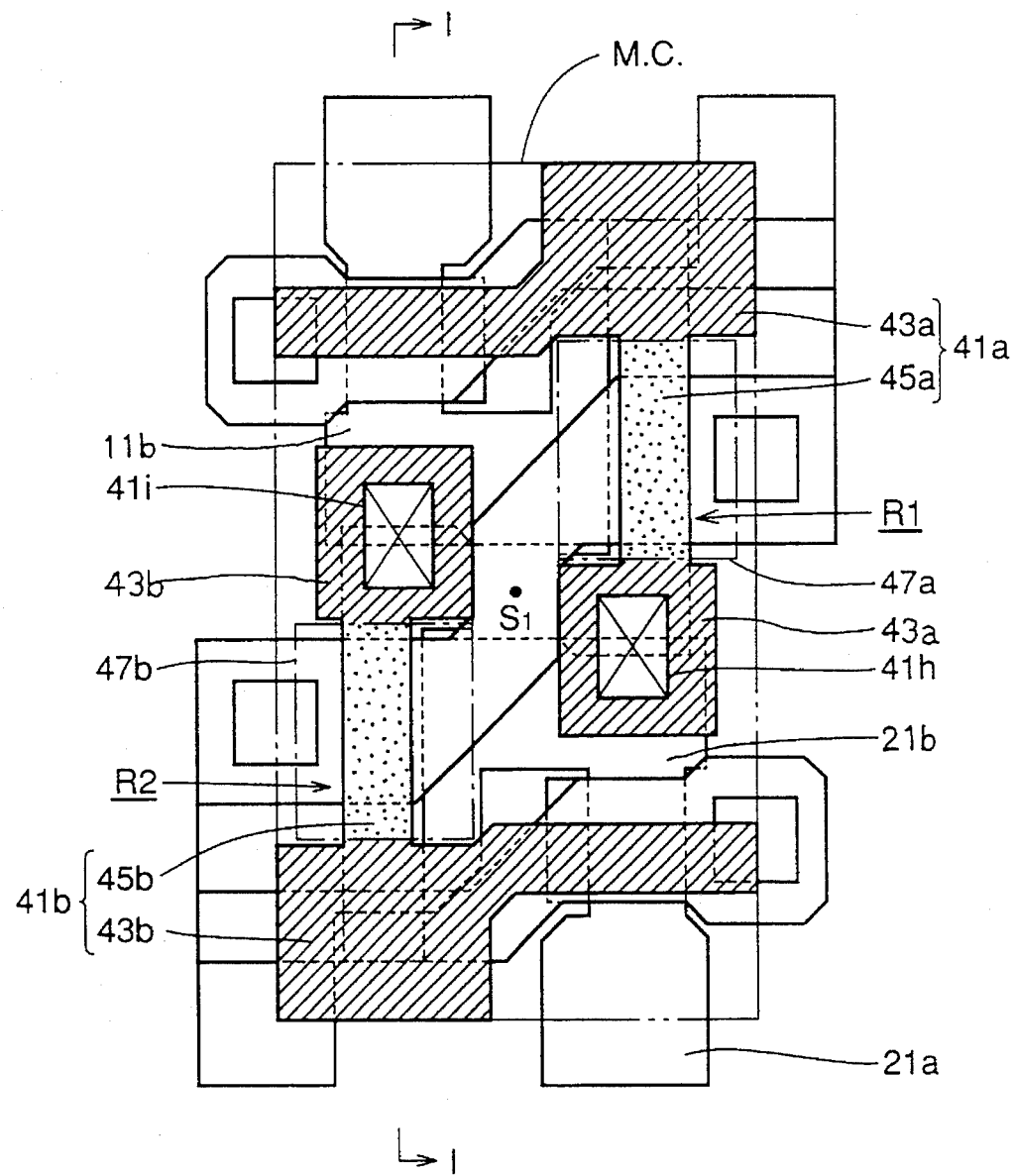

Referring mainly to FIGS. 1 and 4, conductive layers 31a, 31b and 31c are covered with insulating layer 39. Insulating layer 39 is provided with contact hole 41h reaching gate electrode layer 25a of driver transistor Q1 and n-type impurity diffusion region 21b. Insulating layer 39 is also provided with a contact hole 41i which reaches gate electrode layer 25b of driver transistor Q2 and n-type impurity diffusion region 11b. A resistance layer 41a is electrically connected to gate electrode layer 25a and n-type impurity diffusion region 21b through contact hole 41h. Resistance layer 41a has a high resistance region 45a having a high resistance and a low resistance region 43a having a low resistance. High resistance region 45a extends longitudinally in the figure (i.e., in the column direction). Low resistance region 43a is connected to high resistance region 45a, and extends laterally in the figure (i.e., in the row direction).

A resistance layer 41b is in contact with gate electrode layer 25b and n-type impurity diffusion region 11b through contact hole 41i. Resistance layer 41b has a high resistance region 45b having a high resistance and a low resistance region 43b having a low resistance. High resistance region 45b extends longitudinally in the figure. Low resistance region 43b is connected to high resistance region 45b, and extends laterally in the figure.

High resistance regions 45a and 45b form high resistances R1 and R2, respectively.

Resistance layers 41a and 41b are formed by implanting n-type impurity into a polycrystalline silicon layer which has been patterned with a mask, e.g., of photoresist covering regions 47a and 47b defined by alternate long and short dash line. Thus, a region into which the impurity is implanted forms low resistance region 45a, and a region into which the impurity is not implanted forms a high resistance region 45b.

In each memory cell region M.C., resistance layers 41a and 41b are disposed symmetrically with respect to point $S_1$.

Figure 8:
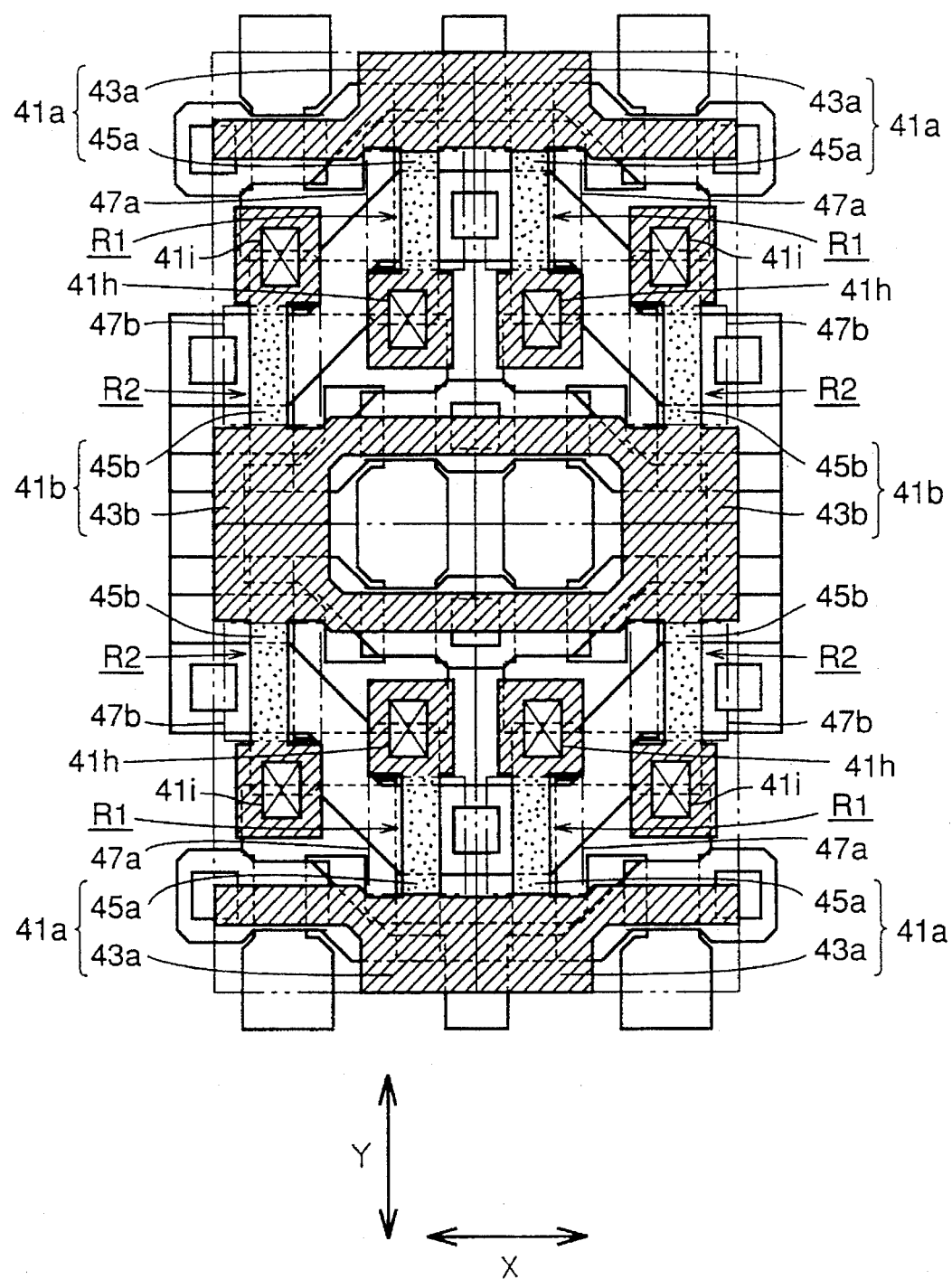

Referring mainly to FIG. 8, low resistance region 43a of resistance layer 41a in one memory cell is connected to low resistance regions 43a in the memory cells adjoining it in the row and column directions. Low resistance region 43b of resistance layer 41b in one memory cell is connected to Low resistance regions 43b in the memory cells adjoining it in the row and column directions. The low resistance regions 43a and 43b which are mutually connected as described above are used, for example, as $V_{cc}$ interconnection regions.

Resistance layers 41a and 41b in one of two memory cells adjoining together in the row direction are disposed symmetrically to those in the other memory cell with respect to line. Resistance layers 41a and 41b in one of two memory cells adjoining together in the column direction are disposed symmetrically to those in the other memory cell with respect to line.

Figure 5:
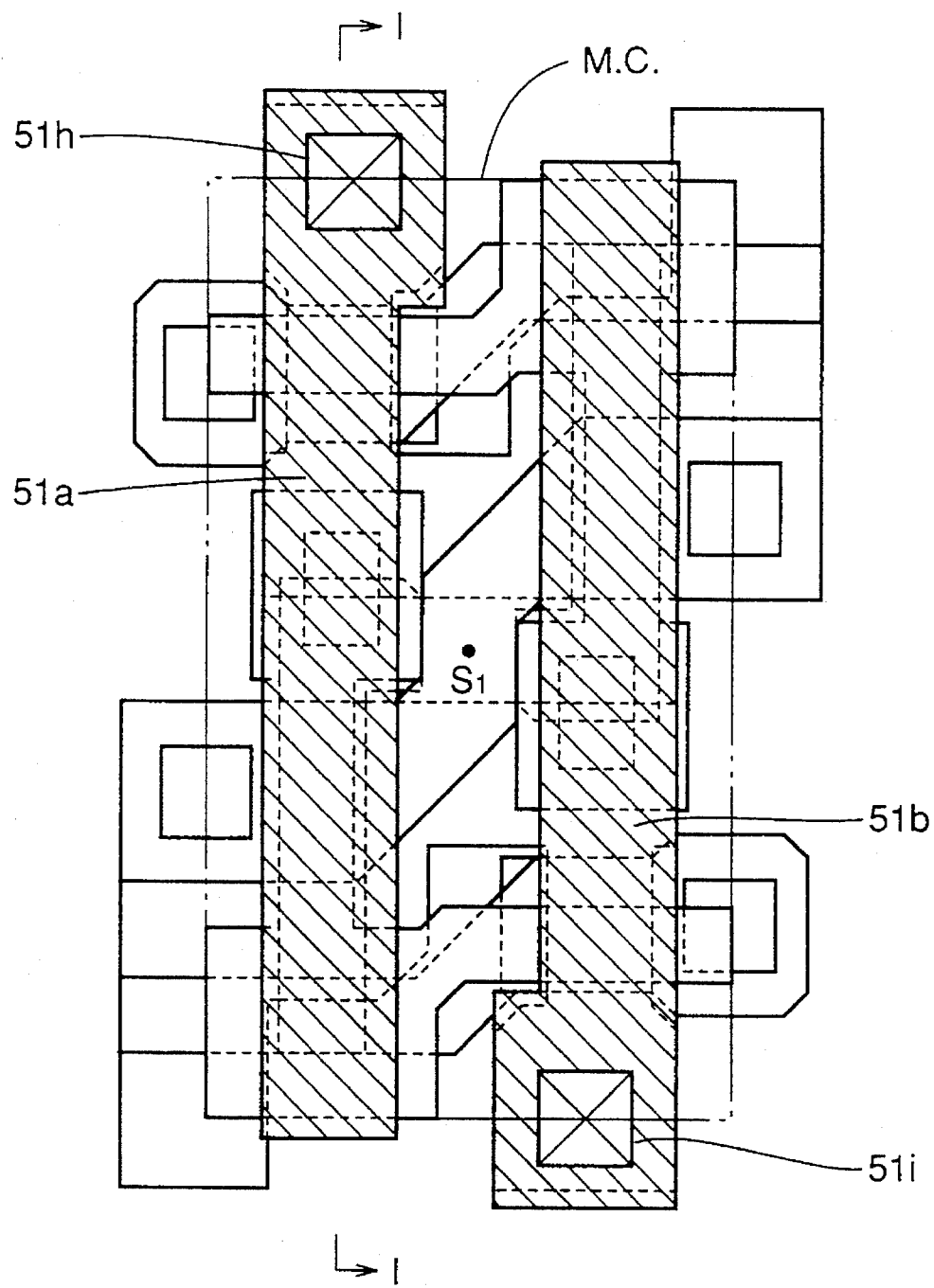

Referring mainly to FIGS. 1 and 5, resistance layers 41a and 41b are covered with an insulating layer 49 made of, e.g., a silicon oxide film of TEOS (Tetra Ethoxy Silane). Insulating layer 49 is provided with contact holes 51h and 51i reaching source/drain regions 11a and 21a of access transistor Q3, respectively. An interconnection layer 51a is formed to be electrically connected to source/drain region 11a of access transistor Q3 through contact hole 51h. An interconnection layer 51b is formed to be electrically connected to source/drain region 21a of access transistor Q4 through contact hole 51i.

Each of interconnection layers 51a and 51b has a three-layer structure formed of a TiN layer 53a, an Al—Si—Cu layer 55a and a TiN layer 57a. In insulating layer 51a thus constructed, TiN layer 53a serves to prevent alloy spike at the contact with impurity region 11a and improve adhesion. An insulating layer 59, which is made of, e.g., a silicon nitride film formed with plasma, is formed over interconnection layers 51a and 51b.

In memory cell region M.C., interconnection layers 51a and 51b are disposed symmetrically with respect to point $S_1$.

Figure 9:
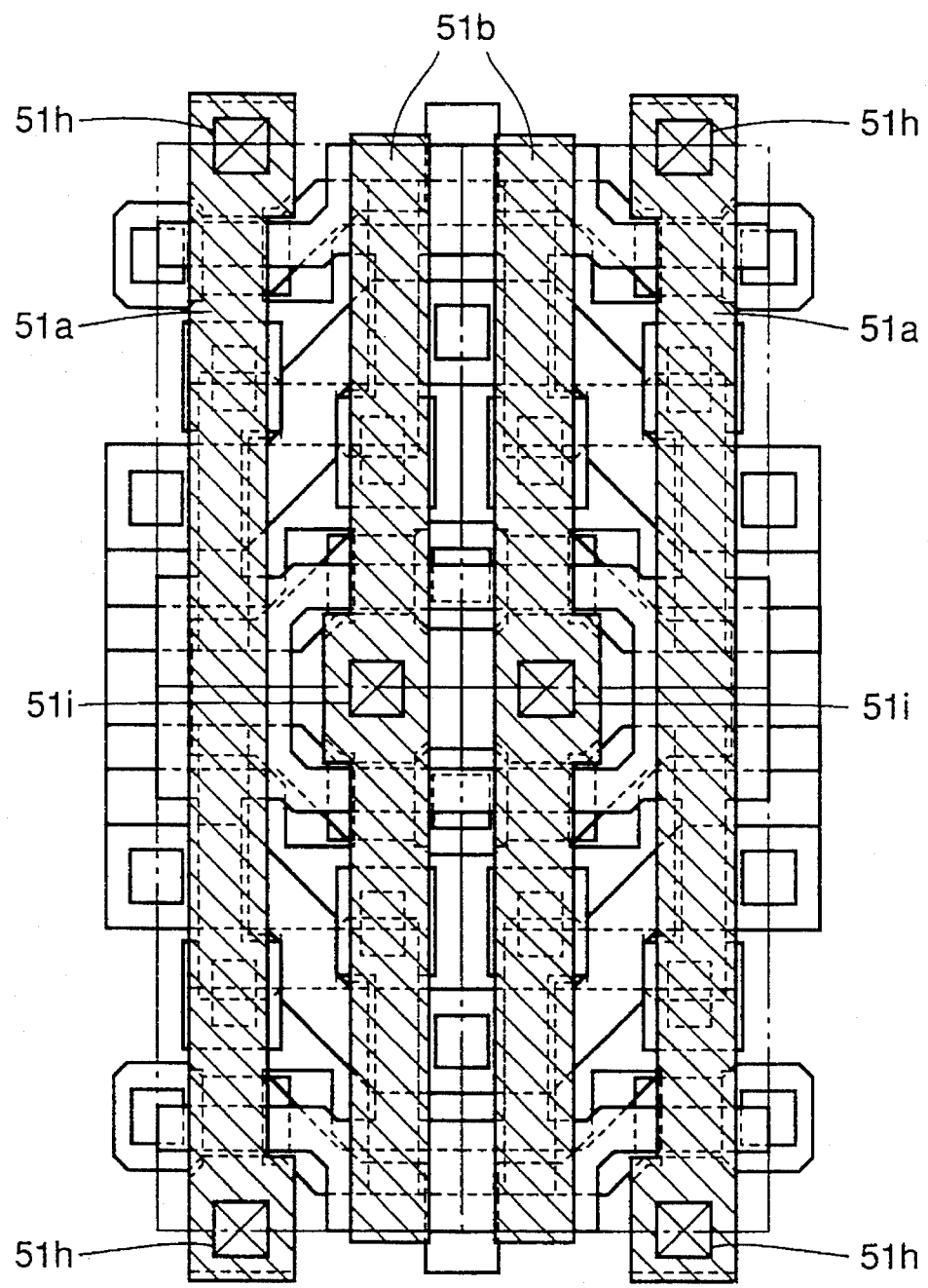

Referring mainly to FIG. 9, interconnection layer 51a mutually connects source/drain regions 11a of access transistors Q3 contained in the memory cells aligned in the column direction. Interconnection layer 51a forms one of the paired bit lines. Interconnection layer 51b mutually connects source/drain regions 21a of access transistors Q4 contained in the memory cells aligned in the column direction. Interconnection layer 51b forms the other of the paired bit lines.

In one of the memory cells adjoining together in the row direction, interconnection layers 51a and 51b are disposed symmetrically to those in the other memory cell with respect to line. In one of the memory cells adjoining together in the column direction, interconnection layers 51a and 51b are disposed symmetrically to these in the other memory cell with respect to line.

Figure 10:
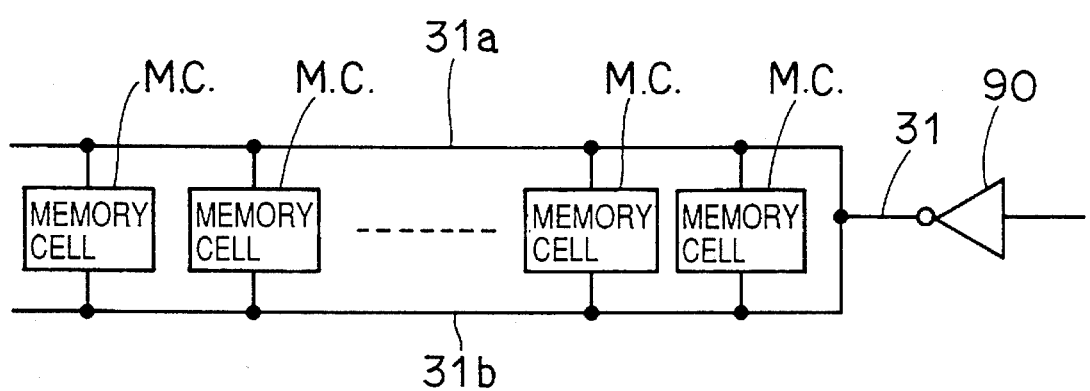
FIG. 10 is an equivalent circuit diagram showing a structure of a word line connected to memory cells aligned in a row direction.

As shown in FIGS. 3 and 7, conductive layers 31a and 31b forming the word line have the so-called split word line structure. As shown in FIG. 10, conductive layers 31a and 31b forming the word line are connected to conductive layer 31 located at the same layer and thus are connected to a word line driver 90 via conductive layer 31. Thereby, conductive layers 31a and 31 forming the first and second word lines and thus forming the word line receive the same signal via word line driver 90.

In the memory cell structure of SRAM of the embodiment described above, gate electrode layers 15a and 15b themselves of access transistors Q3 and Q4 do not form the word line. Alternatively, conductive layers 31a and 31b forming the word line are formed to be connected to gate electrode layers 15a and 15b with the insulating layer therebetween, respectively. Therefore, as shown in FIG. 2, gate electrode layers 15a and 15b are formed to be opposed to at least the channel regions of access transistors Q3 and Q4. It is not necessary to extend gate electrode layers 15a and 15b across memory cell region M.C., in contrast to the case where gate electrode layers 15a and 15b are used as the word line. Since they are not required to extend across memory cell region M.C., it is possible to reduce the planar area occupied by gate electrode layers 15a and 15b in memory cell region M.C. This will be described below in greater detail.

Figure 11:
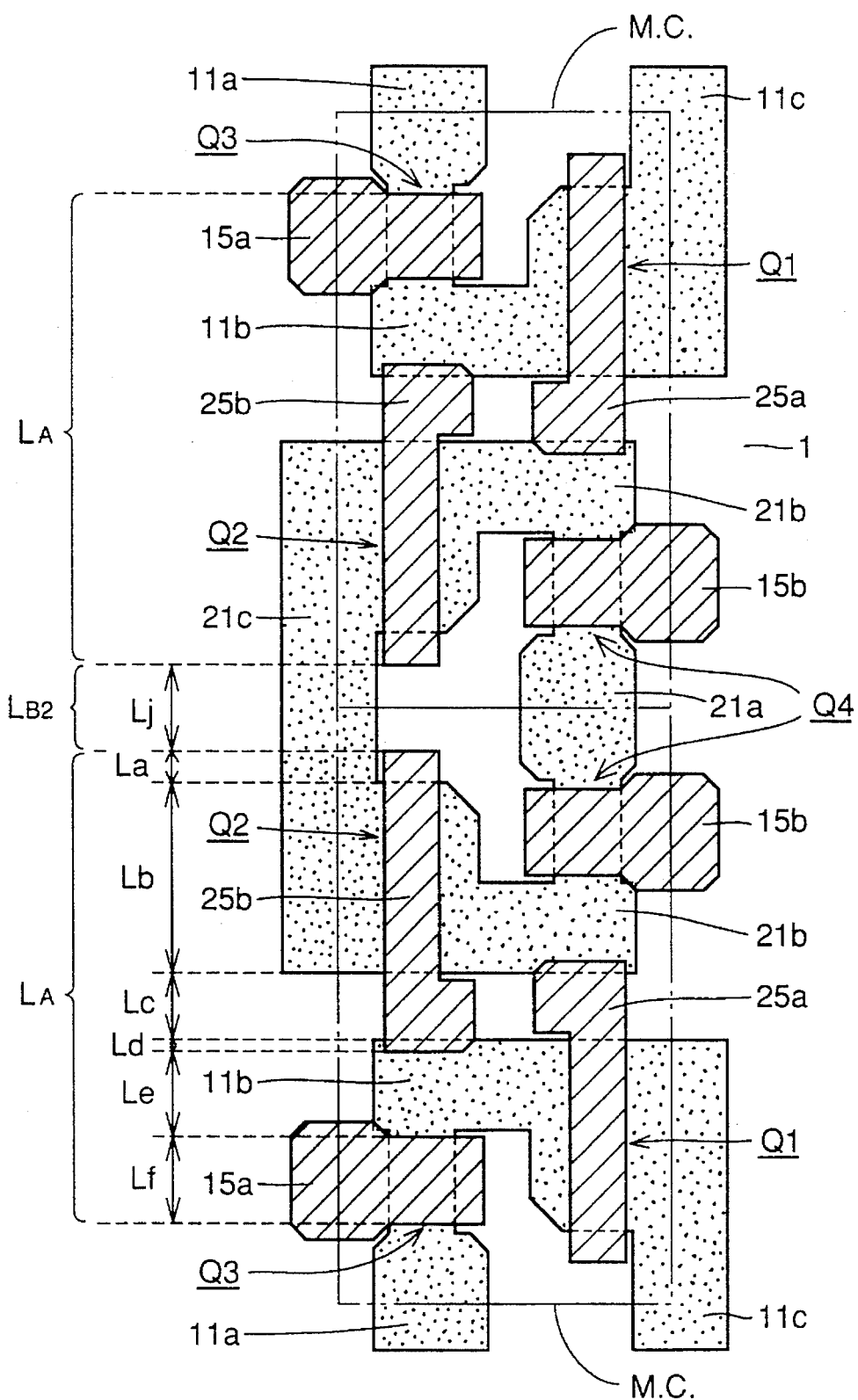
FIG. 11 is a plan showing a section of a memory cell structure corresponding to two bits in the SRAM of the first embodiment of the invention.

Referring to FIGS. 11 and 30, size $L_A$ shown in FIG. 11 is equal to size $L_A$ shown in FIG. 30 provided that they are determined in accordance with the same design rules. The reason of this is that components (sizes $L_a$, $L_b$, $L_c$, $L_d$, $L_e$ and $L_f$) of size $L_A$ in FIG. 11 are the same as components of size $L_A$ shown in FIG. 30.

Structures in FIGS. 11 and 30 differ from each other in the manner of connection between gate electrode layers of driver transistors Q1 and Q2 and source/drain regions of access transistors Q3 and Q4. Therefore, the size $L_d$ in FIG. 11 is slightly different from size $L_d$ in FIG. 30. However, if the same connection manner is used, sizes $L_d$ shown in FIGS. 11 and 30 are equal to each other, so that no inconvenience is caused.

Meanwhile, a size $L_{B1}$ in FIG. 11 is distinctly different from a size $L_{B2}$ in FIG. 30.

The memory cell structure in FIG. 30 uses gate electrode layers 415a and 415b as the word line. Therefore, size $L_{B2}$ increases correspondingly to widths ($2 \times L_h$) of gate electrode layers 415a and 415b and widths ($2 \times L_g$) of the isolating and insulating regions.

In the memory cell structure in FIG. 11, it is not necessary to extend gate electrode layers 15a and 15b across memory cell region M.C., so that size $L_{B2}$ does not contain the widths of gate electrode layers 15a and 15b. Therefore, it is essential for size $L_{B2}$ to contain only a width $L_j$ which enables separation of gate electrode layers 25a and 25b of driver transistors Q1 and Q2 from each other.

Figure 25:
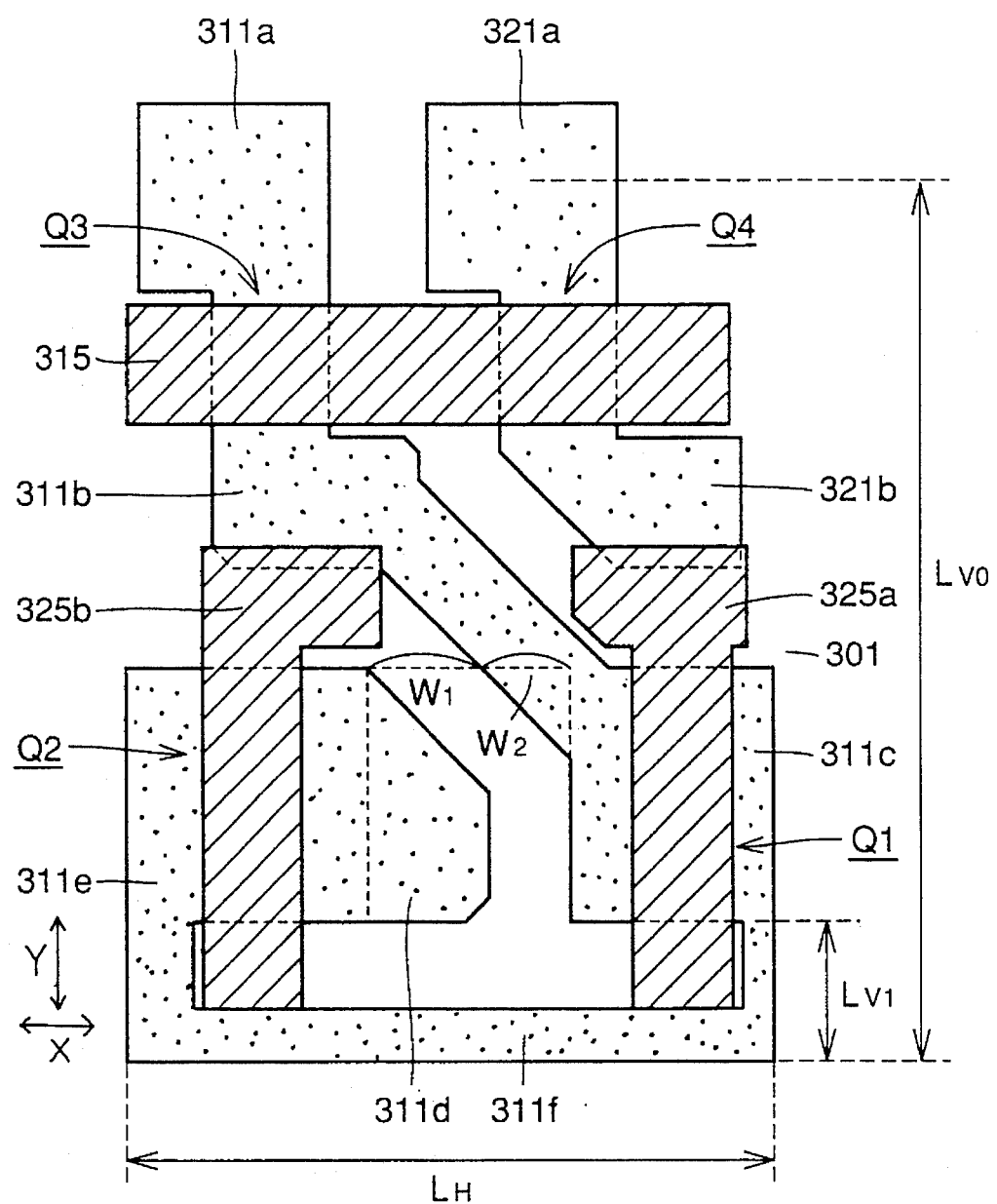
Figure 26:
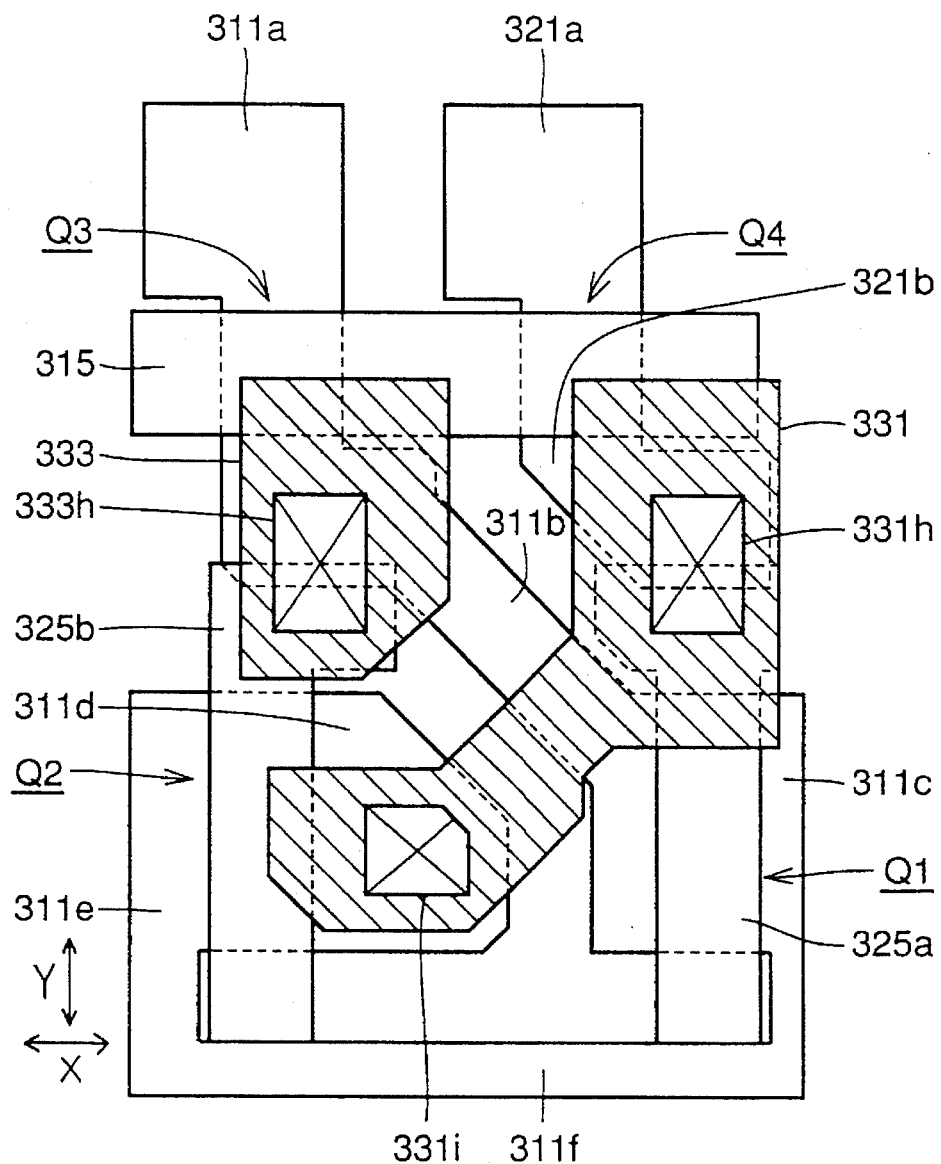
Figure 27:
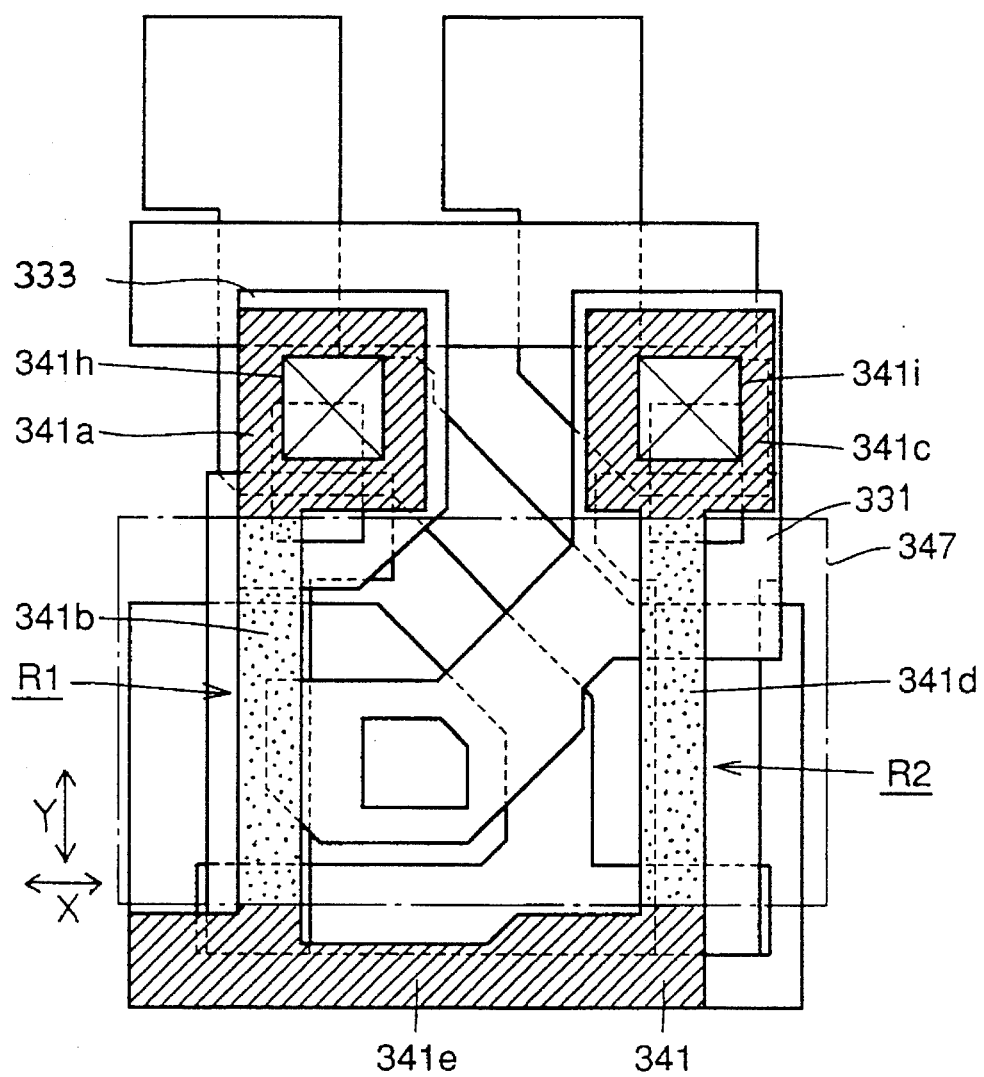
Figure 28:
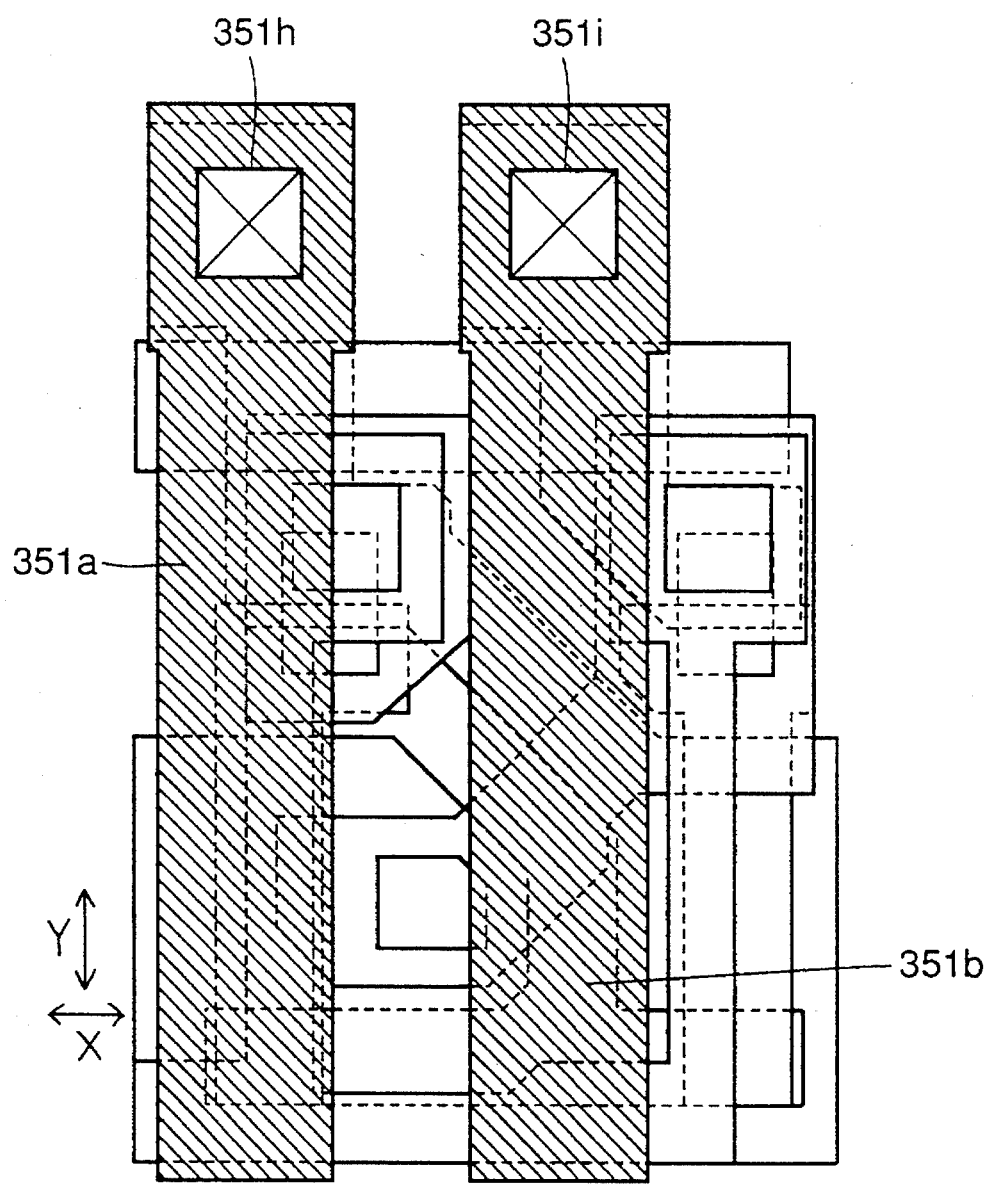

More specifically, while size $L_{B2}$ in FIG. 30 must be at least 3.0 μm ($L_g$, $L_h$, $L_i$=0.6 μm), size $L_{B2}$ in FIG. 11 can be 0.6 μm. An area ratio of the planar layouts of the memory cell structures shown in FIGS. 25, 30 and 11 are 28.70:24.85:20.65.

Since the memory cell structure of this embodiment can reduce size $L_{B2}$ as described above, it is much suitable to the high integration.

In the embodiment described above, as shown in FIG. 6, source region 11c of driver transistor Q1 is integral with and connected to source regions 11c of driver transistors Q1 of respective memory cells adjacent in the row and column directions. Also, source region 21c of driver transistor Q2 is integral with and connected to source regions 21c of driver transistors Q2 of respective memory cells adjacent in the row and column directions. Further, as shown in FIG. 7, source regions 11c and 21c of driver transistor pair Q1 and Q2 forming the memory cell are mutually connected via conductive layer 31c in each memory cell region.

Figure 12:
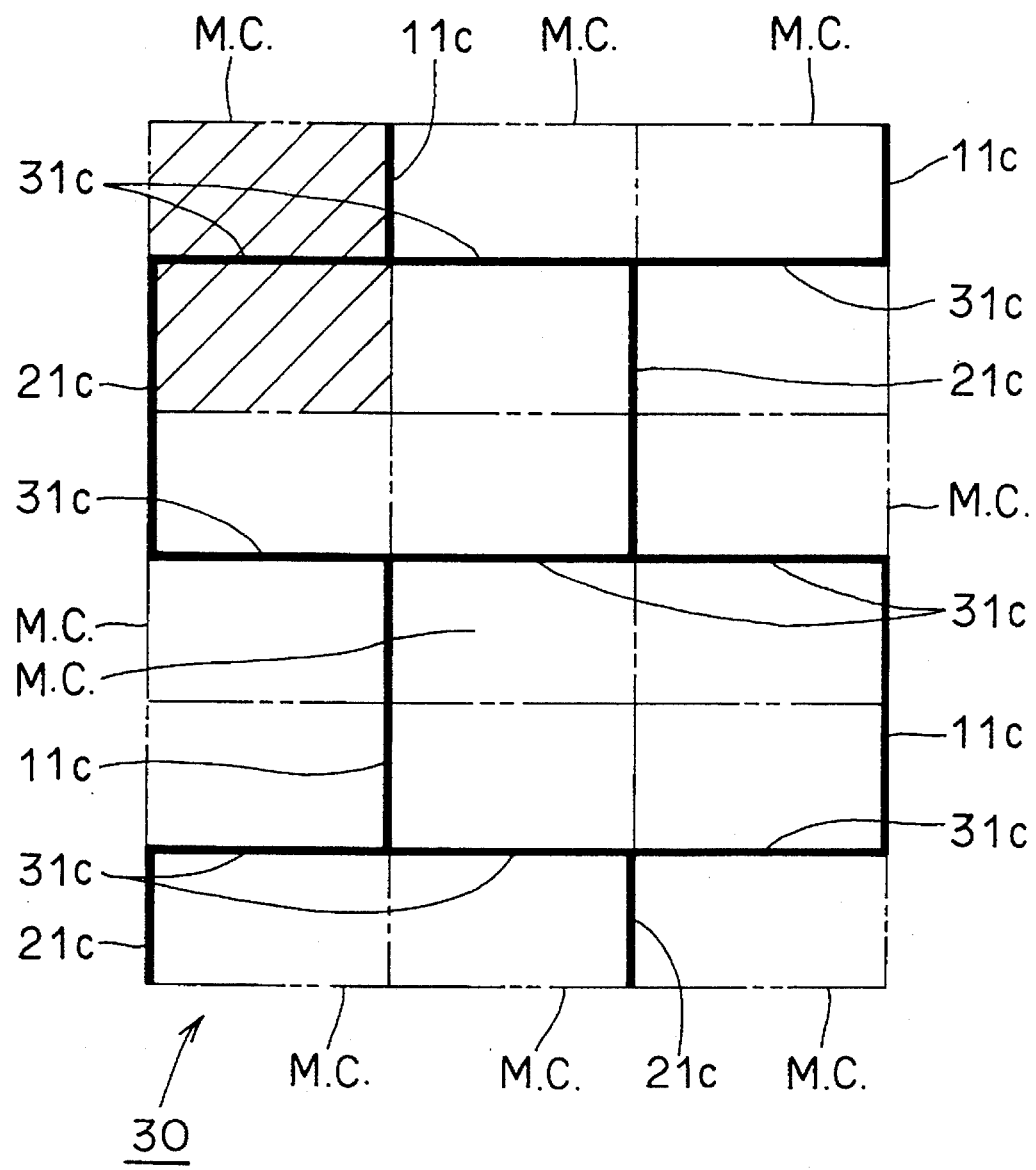
FIG. 12 is a schematic plan showing a section of the memory cell structure of the SRAM of the first embodiment of the invention and particularly showing a connection form of source regions of driver transistor.

Therefore, source regions 11c and 21c of driver transistors Q1 and Q2 in the memory cell array are connected together in a net-like form as shown in FIG. 12.

Referring to FIG. 12, the respective source regions of the driver transistors are connected in a net-like form. Therefore, this structure has the following advantage over the memory cell structure (e.g., in FIG. 29) in which the source regions of the driver transistors are connected in a linear form as shown in FIG. 13.

It should be noted that a hatched area in FIG. 12 represents one memory cell region M.C.

Figure 13:
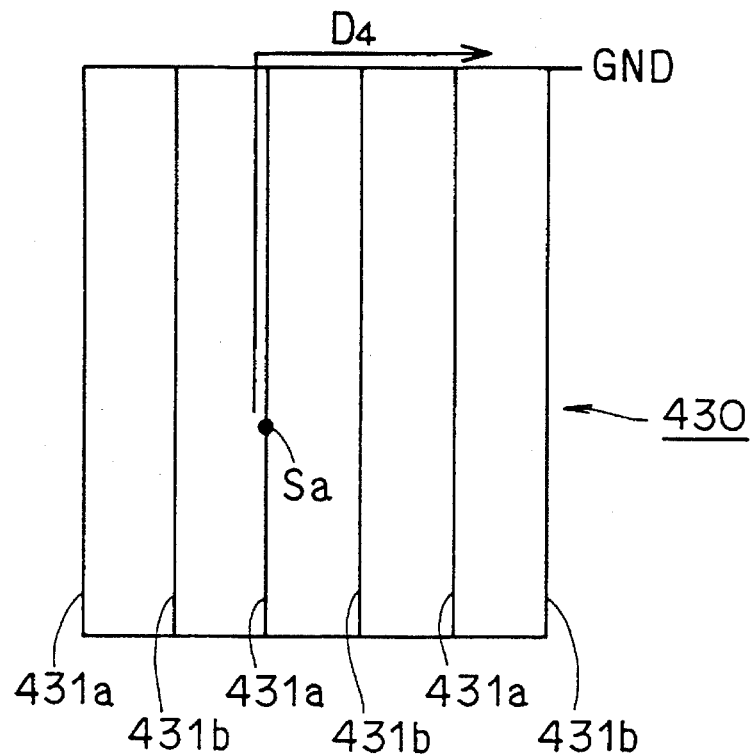

In a linear connection form 430 shown in FIG. 13, a current can flow from a source $S_a$ in a certain driver transistor to GND via only one current path $D_4$.

Meanwhile, in the net-like connection form 30 shown in FIG. 14, a current can flow from a source $S_b$ of a certain driver transistor to GND via a plurality of current paths such as paths $D_1$, $D_2$ and $D_3$. Therefore, the net-like connection form 30 shown in FIG. 14 can reduce the amount of current flowing through each current path as compared with the linear connection form. Accordingly, this embodiment can suppress the influence applied by the interconnection resistance, and thus can achieve the stable operation of the SRAM.

Further, this embodiment can improve the asymmetry in performance caused by the net-like connection form of the source regions of driver transistors.

This will be described below.

Referring to FIG. 15, source/drain region 11b of driver transistor Q3 and drain region 11b of driver transistor Q1 are formed of the n-type impurity diffusion region. Therefore, a parasitic resistance R5 of n-type impurity diffusion region exists between source/drain region 11b of driver transistor Q3 and drain region 11b of driver transistor Q1. Similarly, a parasitic resistance R5 of n-type impurity diffusion region exists between source/drain region 21b of access transistor Q4 and drain region 21b of driver transistor Q2. Source region 21c of driver transistor Q1 and source region 11c of driver transistor Q2 are connected together via conductive layer 31c. Therefore, a parasitic resistance R6 of conductive layer 31c exists between source region 11c of driver transistor Q1 and source region 21c of driver transistor Q2.

Current path $D_a$ extending from source region 11c of driver transistor Q1 to GND does not pass through parasitic resistance R6. Meanwhile, current path $D_b$ extending from source region 21c of driver transistor Q2 to GND passes through parasitic resistance R6. Since only one ($D_b$) of current paths is affected by parasitic resistance R6, symmetry in performance cannot be established in one memory cell.

If the symmetry in performance is not established in one memory cell, the SRAM cannot stably perform the read operation. This will be described below in greater detail.

The read operation of SRAM will be described below with reference to FIG. 16.

For reading data from a memory cell, the bit line pair connected to the power supply and the load is charged to an appropriate potential. A positive voltage is applied to word line WL to set access transistors Q3 and Q4 conductive. The electric charges which have been charged to bit line BL are discharged at driver transistor Q1 (or Q2) at the "L" side in the memory cell. Thereby, the potential of bit line BL connected to the "L" side becomes lower than the potential of bit line BL connected to the "H" side, so that the data in the memory cell is transmitted to bit line BL.

At this time, the resistance of load transistors Q5 and Q6 connected to bit line BL are lower than load R1 (R2) of the memory cell. Therefore, in spite of the discharge by the driver transistor Q1 (Q2) at the "L" side, the potential of storage node N1 (N2) does not attain the initial "L" level of nearly 0 V, but attains a level slightly higher than the same. Therefore, driver transistor Q2 (Q1) becomes slightly conductive, and thus the level of storage node N2 (N1) at the "H" side falls slightly. Thus, a potential difference between storage nodes N1 and N2 decreases. However, when the word line is set to 0 V and the access transistors are turned off after completion of the read operation, storage nodes N1 and N2 automatically return to the complete "L" ("H") level and the complete "H" ("L") level by virtue of the flip-flop circuit in the memory cell, respectively, so that the contents of memory cell are not destroyed. Thus, the read operation of SRAM is nondestructive read.

In the read operation, access transistors Q3 and Q4 as well as transistors Q13 and Q14 are on. Therefore, the memory cell can be deemed as a flip-flop including cross-coupled inverters, one of which includes, as load elements, resistance R1, access transistor Q3, bit line load transistor Q5, column select gate Q13, and I/O line load transistors Q7 and Q9, and the other of which includes, as load elements, resistance R2, access transistor Q4, bit line load transistor Q6, column select gate Q14, and I/O line load transistors Q8 and Q10. Correlation of inputs and outputs of these inverters are represented by curves $C_1$ and $C_2$ in FIG. 17.

Referring to FIG. 17, two intersections Q1 and Q2 of curves $C_1$ and $C_2$ form stable points in the read operation. It is assumed that potentials V1 and V2 of storage nodes N1 and N2 in the storage holding state exist at a point P1a. When the word line is charged and access transistors Q3 and Q4 are turned on, the cell state (V1 and V2) moves from the point P1a to the point Q1 of stable potential in the read operation, so that the memory cell attains the read state. Thereafter, the word line is discharged again, and the access transistors Q3 and Q4 are turned off, so that the cell state changes from Q1 to P1a via P1b (a long time is required between P1b to P1a because of charging from the high resistance load), and returns to the storage holding state. Similarly, change through P2a→Q2→P2b→P2a may be performed.

In order to perform the normal nondestructive read described above, it is necessary that at least I/O transmission curves of the flip-flop in the read operation form an "eye" $h_1$ of an appropriate size. The size of this "eye" $h_1$ can be used as a standard with respect to direct stability in the read operation, and it can be expected that read operation becomes stabler as the size of the "eye" $h_1$ increases. This stability can be quantitatively dealt with, and can be formulated by using diameters $D_0$ and $D_1$ of maximum inscribed circles of the two "eye" $h_1$.

If the memory cell of SRAM has symmetry in performance, the diameters $D_0$ and $D_1$ are equal to each other and can be expressed by the following formula.

$$D_0 = D_1 = \frac{(V_{CC} - V_{TH})(g-1)^2}{(g^2+1)(\sqrt{g^2}+1+\sqrt{2}\ g^3/(g^2+1)+1)} + \frac{V_{TH}(g-1)}{\sqrt{g^2}+1}$$

$g^2 = \beta_D/\beta_A$ $\beta_D = \beta$ of driver transistors Q1 and Q2

$\beta_A = \beta$ of access transistors Q3 and Q4

The above formula represents that diameter $D_0$ ($D_1$) increases and the read operation is performed more stably in accordance with increase of a threshold voltage $V_{TH}$ of the driver transistor and in accordance with the β ratio of driver transistor and access transistor (current drive capability of driver transistor/current drive capability of access transistor). Since the impedance of the access transistor is much larger than the impedance of the parallel structure of the bit line and the load transistor of the I/O line, it is suggested that the effect of the β ratio applied on the direct stability in the read operation may be determined only by taking the β ratio of the driver transistor and access transistor into consideration.

However, if the source regions of driver transistors are connected in a net-like form, the symmetry in performance described above is hardly obtained. If the memory cells are asymmetrical in performance, the I/O transmission curves in FIG. 17 are not symmetrical with respect to the line of V1=V2. Therefore, diameters $D_0$ and $D_1$ of "eye" are not equal to each other as shown in FIG. 18. If diameters $D_0$ and $D_1$ of "eye" are not equal, the stability of the read operation of the memory cell is determined by smaller one between diameters $D_0$ and $D_1$. Therefore, if the symmetry in performance of the memory cell is not obtained, the read operation becomes unstable.

In order to stabilize the read operation of SRAM, therefore, it is necessary to improve the symmetry in performance of the memory cell of SRAM.

In this embodiment, conductive layer 31c having parasitic resistance R6 is formed of the composite film including the doped polycrystalline silicon layer and high melting point silicide layer. This composite film has a sheet resistance value from 5 to 15Ω/□ as already described. This sheet resistance value is remarkably smaller than the sheet resistance value (20 to 80Ω/□) of the layer formed of a single doped polycrystalline silicon layer. As described above, conductive layer 31c in FIG. 7 has a very small resistance value not more than 15Ω/□, the symmetry in performance of the memory cell of SRAM is improved. Accordingly, the stably read operation of SRAM can be achieved.

Although this embodiment has been described in connection with the memory cells of SRAM of the high resistance load type, the invention may be applied to SRAM memory cells of a CMOS type. Structures of the SRAM memory cells of the CMOS type to which the invention is applied will be described below.

Second Embodiment

Referring to FIG. 19, a structure shown in this equivalent circuit diagram is different from that in the equivalent circuit diagram of FIG. 24 in that p-channel MOS transistors are used in place of high resistance loads. More specifically, a pair of load transistors Q5 and Q6 are provided in place of high resistance loads R1 and R2.

Source regions of load transistors Q5 and Q6 are connected to power supply $V_{cc}$, and drain regions thereof are connected to storage nodes N1 and N2, respectively. A gate of load transistor Q5 is connected to the gate of driver transistor Q1 and the drain region of driver transistor Q2. A gate of load transistor Q6 is connected to the gate of driver transistor Q2 and the drain region of driver transistor Q1.

Structures other than the above are similar to those in the equivalent circuit diagram of FIG. 24, and thus will not be described below.

In the memory cell structure of SRAM of this embodiment, structures of driver transistor pair Q1 and Q2 and access transistor pair Q3 and Q4 are similar to those of the first embodiment shown in FIGS. 2 and 3, and thus will not be described below.

Referring mainly to FIGS. 20 and 21, an insulating layer 39 is formed over conductive layers 31a, 31b and 31c. Insulating layer 39 is provided with a contact hole 141h reaching gate electrode layer 20a and n-type impurity diffusion region 21b. Insulating layer 39 is also provided with a contact hole 141i reaching gate electrode layer 25b and n-type impurity diffusion region 11b. A first semiconductor layer 141a is electrically connected to gate electrode layer 25a and n-type impurity diffusion region 21b through contact hole 141h. A first semiconductor layer 141b is electrically connected to gate electrode layer 25b and n-type impurity diffusion region 11b through contact hole 141i. First semiconductor layers 141a and 141b are formed of doped polycrystalline silicon layers which are formed from the same layer.

It should be noted that the section of FIG. 20 used in the above description is taken along line XVII—XVII in FIGS. 21–23.

Referring mainly to FIGS. 20 and 22, a pair of second semiconductor layers 144a and 144b are formed on semiconductor layer pair 141a and 141b with an insulating layer therebetween. First semiconductor layers 141a and 141b and second semiconductor layers 144a and 144b form a thin film transistor (TFT). This thin film transistor forms load transistor pair Q5 and Q6.

Thus, first semiconductor layer pair 141a and 141b form gate electrode layers. Second semiconductor layers 144a and 144b have regions 147a and 147b which are opposed in the direction of thickness to first semiconductor layers 141a and 141b, respectively. Second semiconductor layer 144a has a drain region 143a and a source region 145a which are spaced from each other to define region 147a as a channel region, and second semiconductor layer 144b has a drain region 143b and a source region 145b which are spaced from each other to define region 147b as a channel region.

Drain region 143a is electrically connected to first semiconductor layer 141b through a through hole 144i. Channel region 147a is connected to drain region 143a, and extends longitudinally in the figure (in the column direction). Source region 145a is connected to channel region 147a, and extends laterally in the figure (in the row direction).

Drain region 143b is electrically connected to first semiconductor layer 141a through a through hole 144h. Channel region 147b is connected to drain region 143b, and extends longitudinally in the figure (in the column direction). Source region 145b is connected to channel region 147b, and extends laterally in the figure (in the row direction).

The source/drain regions in second semiconductor layers 144a and 144b are formed by implanting impurity into regions 147a and 147b defined by alternate long and short dash line with a mask.

The second semiconductor layers in memory cell region M.C. are disposed symmetrically with respect to a point $S_2$.

Referring mainly to FIGS. 20 and 23, an insulating layer 49 made of, e.g., a silicon oxide film of TEOS is formed over second semiconductor layers 144a and 144b. Insulating layer 49 is provided with contact holes 51h and 51i reaching source/drain regions 11a and 11b of access transistors Q3 and Q4. Interconnection layers 51a and 51b are electrically connected to source regions 11a and 11b of access transistors Q3 and Q4 through contact holes 51h and 51i, respectively. Interconnection layers 51a and 51b extend longitudinally in the figure (column direction). Interconnection layers 51a and 51b each have a three-layer structure including a TiN layer 53a, an Al—Si—Cu layer 55a and a TiN layer 57a.

Interconnection layers 51a and 51b in memory cell region M.C. are disposed symmetrically with respect to point $S_2$.

A passivation film 59, e.g., made of a silicon oxide film manufactured with plasma is formed over interconnection layers 51a and 51b.

The memory cell structure of SRAM of this embodiment can achieve the same effect as the first embodiment already described.

In the first and second embodiments, conductive layer 31c is formed of the composite layer including the doped polycrystalline silicon layer and the high melting point silicide layer. However, conductive layer 31c may be formed of another layer provided that its sheet resistance is not more than 15Ω/□.

The high melting point silicide layer forming conductive layer 31c may be made of, for example, tungsten silicide ($WSi_2$), titanium silicide ($TiSi_2$) or molybdenum silicide ($MoSi_2$).

The first and second embodiments have been described in connection with the memory cell structures of SRAM of the high resistance load type and the CMOS type. However, the invention may be applied to memory cell structures of SRAM other that the above.

According to an aspect of the invention, the conductive layers, Which is connected to the gate electrode layers of the first and second access transistors with the insulating layer therebetween, can be used as the word line. According to this structure, it is not necessary to use the gate electrode layer itself as the word line. Therefore, the planar area occupied by the gate electrode layer can be reduced as compared with the structure in which the gate electrode layer of access transistor is used as the word line and is extended across the memory cell. Therefore, the planar layout area of the memory cell can be reduced correspondingly to reduction of the gate electrode layers.

Since the planar area occupied by the gate electrode layers in the access transistor can be reduced as described above, it is possible to give a greater freedom of disposition of the gate electrode layers in the access transistor and the gate electrode layers in the driver transistor. Therefore, the planar layout area of the memory cells can be reduced further.

According to another aspect of the invention, the first word line conductive layer, which is formed at the level above the gate electrode layer in the access transistor, serves as the word line. Therefore, it is not necessary to use the gate electrode layer itself as the word line. Accordingly, the planar area occupied by the gate electrode layer in the access transistor can be reduced as compared with the structure where the gate electrode layer is used as the word line and is extended across the memory cell. Consequently, the planar layout area of the memory cell can be reduced correspondingly to reduction of the gate electrode layers.

Since the size of the gate electrode layers in the access transistors can be reduced as described above, it is possible to give a greater freedom of disposition of the gate electrode layers in the access transistor and the gate electrode layers in the driver transistors. Therefore, the planar layout area of the memory cells can be reduced further.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device including a static memory cell having an access transistor pair and a driver transistor pair in a memory cell region, comprising:

a semiconductor substrate having a main surface;

a first access transistor having a gate electrode layer formed on the main surface of said semiconductor substrate with a gate insulating film therebetween;

a second access transistor having a gate electrode layer formed on the main surface of said semiconductor substrate with a gate insulating film therebetween, said gate electrode layers of said first and second access transistors being formed from two portions of the same conductive layer, which portions are isolated from each other;

a first driver transistor having a gate electrode layer formed on the main surface of said semiconductor substrate with a gate insulating film therebetween;

a second driver transistor having a gate electrode layer formed on the main surface of said semiconductor substrate with a gate insulating film therebetween;

an insulating layer formed over and around said gate electrode layer of each of said transistors, and having a first contact hole reaching a top surface of said gate electrode layer of said first access transistor and a second contact hole reaching a top surface of said gate electrode layer of said second access transistor; and a conductive layer formed on said insulating layer and connected to said gate electrode layers of said first and second access transistors via said first and second contact holes.

2. The semiconductor memory device according to claim 1, wherein said conductive layer includes a first conductive layer extending across said memory cell region and connected to said gate electrode layer of said first access transistor through said first contact hole, and a second conductive layer extending across said memory cell region and connected to said gate electrode layer of said second access transistor through said second contact hole.

3. A semiconductor memory device comprising:

a plurality of memory cells arranged in rows and columns at a main surface of a semiconductor substrate, each of said memory cells including a first driver transistor having a pair of source/drain regions formed at the main surface of said semiconductor substrate and a gate electrode layer formed on a portion of the main surface of said semiconductor substrate between said pair of source/drain regions with a gate insulating film therebetween, a second driver transistor having a pair of source/drain regions formed at the main surface of said semiconductor substrate and a gate electrode layer formed on a portion of the main surface of said semiconductor substrate between said pair of source/drain regions with a gate insulating film therebetween, a first access transistor having a pair of source/drain regions formed at the main surface of said semiconductor substrate and a gate electrode layer formed on a portion of the main surface of said semiconductor substrate between said pair of source/drain regions with a gate insulating film therebetween, a second access transistor having a pair of source/drain regions formed at the main surface of said semiconductor substrate and a gate electrode layer formed on a portion of the main surface of said semiconductor substrate between said pair of source/drain regions with a gate insulating film therebetween, said gate electrode layers of said first and second driver transistors and said first and second access transistors being formed from four portions of the same conductive layer, which portions are isolated from each other;

a plurality of word lines arranged in a plurality of rows, each of said word lines having a first word line conductive layer formed at a layer above said gate electrode layer of said access transistor of said memory cell and electrically connected to said gate electrode layers of said first access transistors of said plurality of memory cells arranged in the corresponding row, and a second word line conductive layer formed at a layer above said gate electrode layer of said access transistor of said memory cell and electrically connected to said gate electrode layers of said second access transistors of said plurality of memory cells arranged in the corresponding row, said first word line conductive layer and said second word line conductive layer being electrically connected together and being formed of a common second conductive layer; and a plurality of bit line pairs arranged in a plurality of columns, each of said bit line pairs having a first bit line formed at a layer above said gate electrode layer of said access transistor of said memory cell and electrically connected to one of said source/drain regions of each of said first access transistors of said plurality of memory cells arranged in the corresponding column, and a second bit line formed at a layer above said gate electrode layer of said access transistor of said memory cell and electrically connected to one of said source/drain regions of each of said second access transistors of said plurality of memory cells arranged in the corresponding column, said first and second bit lines being formed of a third conductive layer different from said second conductive layer.

4. The semiconductor memory device according to claim 3, wherein in each of said memory cell said first driver transistor and said first access transistor are aligned in a row direction, said second driver transistor and said second access transistor are aligned in a row direction, said first driver transistor and said second access transistor are aligned in a column direction, and said second driver transistor and said first access transistor are aligned in the column direction.

5. The semiconductor memory device according to claim 4, wherein, in each memory cell said pair of source/drain regions of said first driver transistor are aligned in the row direction, said pair of source/drain regions of said second driver transistor are aligned in the row direction, said pair of source/drain regions of said first access transistor are aligned in the column direction such that the other one of said source/drain regions is located near a center point of said memory cell, said pair of source/drain regions of said second access transistor are aligned in the column direction such that the other one of said source/drain regions is located near said center point, one of said source/drain regions, which is located near said center point, of said first driver transistor and said the other one source/drain region of said first access transistor are electrically connected together via an impurity region formed at the main surface of said semiconductor substrate, and one of said source/drain regions, which is located near said center point, of said second driver transistor and said the other one source/drain region of said second access transistor are electrically connected together via an impurity region formed at the main surface of said semiconductor substrate; and a line extended from said gate electrode layer of said first access transistor in the row direction crosses said gate electrode layer of said first driver transistor, and a line extended from said gate electrode layer of said second access transistor in the row direction crosses said gate electrode layer of said second driver transistor.

6. The semiconductor memory device according to claim 3, wherein said plurality of memory cells are divided into groups, each of which includes two memory cells adjoining together in the row direction and two memory cells adjoining said two memory cells in the column direction, said two memory cells adjoining together in the row direction in each group are arranged in axial symmetry, said two memory cells adjoining together in the column direction in each group are arranged in axial symmetry, and said plurality of groups, one said group being a unit, are arranged in the row and column directions.

7. The semiconductor memory device according to claim 6, wherein in each of said groups including said four memory cells, said two memory cells adjoining in the row direction include said first driver transistors of which said other source/drain regions are electrically connected together via an impurity region formed at the main surface of said semiconductor substrate, said two memory cells adjoining in the row direction include said second access transistors of which said gate electrode layers are electrically connected together via said first conductive layer, said two memory cells adjoining in the column direction include said second driver transistors which said other source/drain regions are electrically connected together via an impurity region formed at the main surface of said semiconductor substrate, and said two memory cells adjoining in the column direction include said second access transistors, said one source/drain region in each of which is electrically connected to said one source/drain region of the other of said second access transistors via an impurity region formed at the main surface of said semiconductor substrate.

8. The semiconductor memory device according to claim 4, wherein said gate electrode layer of said first driver transistor and said pair of source/drain regions of said second access transistor are aligned linearly in the column direction, and said gate electrode layer of said second driver transistor and said pair of source/drain regions of said first access transistor are aligned linearly in the column direction.

9. The semiconductor memory device according to claim 3, wherein said first and second word line conductive layers forming each of said word lines extend in the row direction, and said other source/drain regions of said first and second driver transistors in each memory cell are formed of said second conductive layer, and connected to a ground conductive layer disposed parallel to and between said first and second word line conductive layers in the corresponding row.

10. The semiconductor memory device according to claim 9, wherein said first and second word line conductive layers forming each of said word lines and said ground conductive layer each have a double layer formed of a polycrystalline silicon layer and a high melting point silicide layer.

11. The semiconductor memory device according to claim 3, wherein each of said memory cells has a first resistance layer formed at a layer above said gate electrode layer of said driver transistor, and is formed of a fourth conductive layer different from said second and third conductive layers, said first resistance layer having one end connected to said one source/drain region of said first driver transistor and said gate electrode layer of said second driver transistor, and the other end connected to a power supply potential line; and a second resistance layer formed of said fourth conductive layer and having one end connected to said one source/drain region of said second driver transistor and said gate electrode layer of said first driver transistor, and the other end connected to said power supply potential line.

12. The semiconductor memory device according to claim 3, wherein each of said memory cell includes a first load transistor having a first semiconductor layer formed at a layer above said gate electrode layer of said driver transistor, and formed of a fourth conductive layer different from said second and third conductive layer, provided with said pair of source/drain regions, one of which is connected to said one source/drain region of said first driver transistor and said gate electrode layer of said second driver transistor, and the other of which is connected to a power supply potential line, and a second load transistor having a second semiconductor layer formed of said fourth conductive layer, and provided with said pair of source/drain regions, one of which is connected to said one source/drain region of said second driver transistor and said gate electrode layer of said first driver transistor, and the other of which is connected to said power supply potential line.

13. The semiconductor memory device according to claim 3, further comprising a ground conductive layer formed extending in a row direction at a layer above said gate electrode layers of said driver transistors and said access transistors so as to be electrically connected to one of said source/drain regions of said first driver transistor and one of said source/drain regions of said second driver transistor, wherein one of said source/drain regions of said first driver transistor of a first memory cell and one of said source/drain regions of said first driver transistor of a second memory cell adjacent to one side of said first memory cell in a column direction are electrically connected by an impurity region formed at the main surface of said semiconductor substrate, wherein one of said source/drain regions of said second driver transistor of said first memory cell and one of said source/drain regions of said second driver transistor of a third memory cell adjacent to the other side of said first memory cell in the column direction are electrically connected by an impurity region formed at the main surface of said semiconductor substrate.

14. The semiconductor memory device according to claim 11, further comprising a ground conductive layer formed at a layer above said gate electrode layers of said driver transistors and said access transistors so as to be electrically connected to the other of said source/drain regions of said first driver transistor and the other of said source/drain regions of said second driver transistor, wherein said first and second resistance layers and said power supply potential line are formed at a layer above said ground conductive layer.

15. The semiconductor memory device according to claim 14, wherein said power supply potential line comprises first and second power supply potential line conductive layers provided isolated from each other in said memory cell region, wherein said first power supply potential line conductive layer is electrically connected to the other end of said first resistance layer and extends so as to cross said memory cell region in the row direction, wherein said second power supply potential line conductive layer is electrically connected to the other end of said second resistance layer and extends so as to cross said memory cell region in the row direction.

16. The semiconductor memory device according to claim 12, further comprising a ground conductive layer formed at a layer above said gate electrode layers of said driver transistors and said access transistors so as to be electrically connected to the other of said source/drain regions of said first driver transistor and the other of said source/drain regions of said second driver transistor, wherein said first and second load transistors and said power supply potential line are formed at a layer above said ground conductive layer.

17. The semiconductor memory device according to claim 16, wherein said power supply potential line comprises first and second power supply potential line conductive layers provided isolated from each other in said memory cell region, wherein said first power supply potential line conductive layer is electrically connected to the other of said source/drain regions of said first load transistor and extends so as to cross said memory cell region in the row direction, wherein said second power supply potential line conductive layer is electrically connected to the other of said source/drain regions of said second load transistor and extends so as to cross said memory cell region in the row direction.

18. A semiconductor memory device comprising a plurality of memory cells arranged in a plurality of rows and columns at a main surface of a semiconductor substrate, wherein each of said plurality of memory cells comprises first and second driver transistors and first and second access transistors, said first driver transistor including a pair of source/drain regions formed at the main surface of said semiconductor substrate and a gate electrode layer formed on the main surface of said semiconductor substrate between said source/drain regions with a gate insulating film thereunder, said second driver transistor including a pair of source/drain regions formed at the main surface of said semiconductor substrate and a gate electrode layer formed on the main surface of said semiconductor substrate between said source/drain regions with a gate insulating film thereunder, said first access transistor including a pair of source/drain regions formed at the main surface of said semiconductor substrate and a gate electrode layer formed on the main surface of said semiconductor substrate between said source/drain regions with a gate insulating film thereunder, said second access transistor including a pair of source/drain regions formed at the main surface of said semiconductor substrate and a gate electrode layer formed on the main surface of said semiconductor substrate between said pair of source/drain regions with a gate insulating film thereunder, said gate electrode layers of said first and second driver transistors and said first and second access transistors being formed from four portions of the same conductive layer, which portions are isolated from each other, said gate electrode layer of said first driver transistor being located on the prolongation of a line in the row direction of said gate electrode layer of said first access transistor, said gate electrode layer of said second driver transistor being located on the prolongation of a line in the row direction of said gate electrode layer of said second access transistor.

19. The semiconductor memory device according to claim 18, further comprising first and second word line conductive layers arranged in a plurality of rows and electrically connected to each other, wherein said first word line conductive layer is formed at a layer above said gate electrode layers of said access transistors of said memory cell, and electrically connected to said gate electrode layer of said first access transistor of a plurality of said memory cells arranged in a corresponding row, wherein said second word line conductive layer is formed at a layer above said gate electrode layers of said access transistors of said memory cell, and electrically connected to said gate electrode layer of said second access transistor of a plurality of said memory cells arranged in a corresponding row.

20. The semiconductor memory device according to claim 19, further comprising a ground conductive layer, wherein said first and second word line conductive layers are arranged in parallel along the row direction, wherein said ground conductive layer is formed at a layer above said gate electrode layers of said driver transistors and said access transistors, electrically connected to respective of one of said source/drain regions of said first and second driver transistors, and extending in the row direction sandwiched between said first and second word line conductive layers arranged in a corresponding row.

21. A semiconductor memory device comprising:

a first driver transistor including a pair of source/drain regions formed along a row direction at a main surface of a semiconductor substrate and a gate electrode layer formed extending along a column direction on the main surface of said semiconductor substrate between said pair of source/drain regions with a gate insulating film thereunder, a second driver transistor including a pair of source/drain regions formed along the row direction at the main surface of said semiconductor substrate and a gate electrode layer formed extending along the column direction on the main surface of said semiconductor substrate between said pair of source/drain regions with a gate insulating film thereunder, a first access transistor including a pair of source/drain regions formed along the column direction at the main surface of said semiconductor substrate and a gate electrode layer formed extending along the row direction on the main surface of said semiconductor substrate between said pair of source/drain regions with a gate insulating film thereunder, a second access transistor including a pair of source/drain regions formed along the column direction at the main surface of said semiconductor substrate and a gate electrode layer formed extending along the row direction on the main surface of said semiconductor substrate between said pair of source/drain regions with a gate insulating film thereunder, wherein one of said source/drain regions of said first driver transistor and one of said source/drain regions of said first access transistor are electrically connected by an impurity region formed at the main surface of said semiconductor substrate so as to extend in the row direction, wherein one of said source/drain regions of said second driver transistor and one of said source/drain regions of said second access transistor are electrically connected by an impurity region formed at the main surface of said semiconductor substrate so as to extend in the row direction, said gate electrode layers of said first and second driver transistors and said first and second access transistors being formed from four portions of the same conductive layer, which portions are isolated from each other, said gate electrode layer of said first driver transistor being located on the prolongation of a line in the row direction of said gate electrode layer of said first access transistor, said gate electrode of said second driver transistor being located on the prolongation of a line in the row direction of said gate electrode layer of said second access transistor, said semiconductor memory device further comprising:
a first word line conductive layer formed at a layer above said gate electrode layer of said access transistor of said memory cell, extending in the row direction so as to cross said memory cell region, and electrically connected to said gate electrode layer of said first access transistor, a second word line conductive layer formed at a layer above said gate electrode layer of said access transistor of said memory cell, extending in the row direction so as to cross said memory cell region, and electrically connected to said gate electrode layer of said second access transistor, wherein said first and second word line conductive layers extend in parallel with a predetermined distance therebetween in said memory cell region, and a ground conductive layer electrically connected to the other of said source/drain regions of said first driver transistor and the other of said source/drain regions of said second driver transistor, by extending in the row direction sandwiched between said first and second word line conductive layers extending in parallel in said memory cell region.

22. The semiconductor memory device according to claim 2, wherein said first and second conductive layers are formed isolated from each other in said memory cell region, and extending in parallel so as to cross said memory cell region in the row direction, wherein said insulating layer includes a third contact hole reaching one of said source/drain regions of said first driver transistor, and a fourth contact hold reaching one of said source/drain regions of said second driver transistor, said semiconductor memory device further comprising a ground conductive layer electrically connected to one of said source/drain regions of said first driver transistor through said third contact hole, and electrically connected to one of said source/drain regions of said second driver transistor through said fourth contact hole, wherein said ground conductive layer extends in the row direction sandwiched between said first and second conductive layers extending in parallel.

23. A semiconductor memory device comprising a plurality of memory cells arranged in a plurality of rows and columns at a main surface of a semiconductor substrate, wherein each of said plurality of memory cells includes first and second driver transistors and first and second access transistors, said first driver transistor including a pair of source/drain regions formed along a row direction at a main surface of said semiconductor substrate, and a gate electrode layer formed extending along a column direction on the main surface of said semiconductor substrate between said pair of source/drain regions with a gate insulating film thereunder, said second driver transistor including a pair of source/drain regions formed along the row direction at the main surface of said semiconductor substrate, and a gate electrode layer formed extending along the column direction on the main surface of said semiconductor substrate between said source/drain regions with a gate insulating film thereunder, said first access transistor including a pair of source/drain regions formed along the column direction at the main surface of said semiconductor substrate, and a gate electrode layer formed extending along the row direction on the main surface of said semiconductor substrate between said pair of source/drain regions with a gate insulating film thereunder, said second access transistor including a pair of source/drain regions formed along the column direction at the main surface of said semiconductor substrate, and a gate electrode layer formed extending along the row direction on the main surface of said semiconductor substrate between said pair of source/drain regions with a gate insulating film thereunder, said gate electrode layers of said first and second driver transistors and said first and second access transistors being formed from four portions of the same conductive layer, which portions are isolated from each other, wherein said first driver transistor and said first access transistor are arranged along the row direction, said second driver transistor and said second access transistor are arranged along the row direction, said first driver transistor and said second access transistor are arranged along the column direction, and said second driver transistor and said first access transistor are arranged along the column direction, in each memory cell, said gate electrode layer of said first driver transistor being located on the prolongation of a line in the row direction of said gate electrode layer of said first access transistor, said gate electrode layer of said second driver transistor being located on the prolongation of a line in the row direction of said gate electrode layer of said second access transistor, wherein one of said source/drain regions of said first driver transistor and one of said source/drain regions of said first access transistor are electrically connected by an impurity region formed at the main surface of said semiconductor substrate so as to extend in the row direction, wherein one of said source/drain regions of said second driver transistor and one of said source/drain regions of said second access transistor are electrically connected by an impurity region formed at the main surface of said semiconductor substrate so as to extend in the row direction, wherein a first memory cell and a second memory cell adjacent to one side of said first memory cell in the column direction are arranged so that said first driver transistor of said first memory cell and said first driver transistor of said second memory cell are opposed to each other in the column direction, wherein the other of said source/drain regions of said first driver transistor of said first memory cell and the other of said source/drain regions of said first driver transistor of said second memory cell are electrically connected by an impurity region formed at the main surface of said semiconductor substrate, wherein said first memory cell and a third memory cell adjacent to the other side of said first memory cell in the column direction are arranged so that said second driver transistor of said first memory cell and said second driver transistor of said third memory cell are opposed to each other in the column direction, wherein the other of said source/drain regions of said second driver transistor of said first memory cell and the other of said source/drain regions of said second driver transistor of said third memory cell are electrically connected by an impurity region formed at the main surface of said semiconductor substrate, wherein said first memory cell and a fourth memory cell adjacent to one side of said first memory cell in the row direction are arranged so that said first driver transistor of said first memory cell and said first driver transistor of said fourth memory cell are opposed to each other in the row direction, wherein the other of said source/drain regions of said first driver transistor of said first memory cell and the other of said source/drain regions of said first driver transistor of said fourth memory cell are electrically connected by an impurity region formed at the main surface of said semiconductor substrate, wherein said first memory cell and a fifth memory cell adjacent to the other side of said first memory cell in the row direction are arranged so that said second driver transistor of said first memory cell and said second driver transistor of said fifth memory cell are opposed to each other in the row direction, wherein the other of said source/drain regions of said second driver transistor of said first memory cell and the other of said source/drain regions of said second driver transistor of said fifth memory cell are electrically connected by an impurity region formed at the main surface of said semiconductor substrate, said semiconductor memory device further comprising:

a first word line conductive layer formed at a layer above said gate electrode layers of said access transistors of said memory cell, electrically connected to said gate electrode layer of said first access transistor of a plurality of said memory cells arranged in a corresponding row by extending in the row direction crossing said memory cell region, a second word line conductive layer formed at a layer above said gate electrode layers of said access transistors of said memory cell, electrically connected to said gate electrode layer of said second access transistor of a plurality of said memory cells arranged in a corresponding row by extending in the row direction crossing said memory cell region, wherein said first and second word line conductive layers extend in parallel with a predetermined distance therebetween in said memory cell region, a ground conductive layer electrically connected to the other of said source/drain regions of said first driver transistor and the other of said source/drain regions of said second driver transistor of a plurality of said memory cells arranged in a corresponding row, by extending in the row direction sandwiched between said first and second word line conductive layers extending in parallel in said memory cell region.

* * * * *